(12) United States Patent
Fujimoto et al.

(10) Patent No.: US 11,217,590 B2
(45) Date of Patent: Jan. 4, 2022

(54) SEMICONDUCTOR MEMORY DEVICE AND METHOD OF FORMING THE SAME

(71) Applicant: MICRON TECHNOLOGY, INC., Boise, ID (US)

(72) Inventors: Toshiyasu Fujimoto, Higashihiroshima (JP); Takashi Sasaki, Higashihiroshima (JP); Shinobu Terada, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/841,055

(22) Filed: Apr. 6, 2020

(65) Prior Publication Data
US 2021/0313330 A1 Oct. 7, 2021

(51) Int. Cl.
*H01L 21/00* (2006.01)
*H01L 27/108* (2006.01)

(52) U.S. Cl.
CPC .. *H01L 27/10823* (2013.01); *H01L 27/10876* (2013.01); *H01L 27/10894* (2013.01); *H01L 27/10897* (2013.01)

(58) Field of Classification Search
CPC ......... H01L 27/10823; H01L 27/10876; H01L 27/10894; H01L 27/10897
See application file for complete search history.

(56) References Cited

U.S. PATENT DOCUMENTS

| | | | | |
|---|---|---|---|---|
| 6,515,914 B2* | 2/2003 | Keeth | ............... | G11C 7/1045 |
| | | | | 365/189.15 |
| 10,354,705 B2* | 7/2019 | Ohgami | ............... | G11C 7/08 |

* cited by examiner

*Primary Examiner* — Richard A Booth
(74) *Attorney, Agent, or Firm* — Dorsey & Whitney LLP

(57) ABSTRACT

A semiconductor memory device includes a memory cell region; a memory mat end region; a memory mat including the memory cell region and the memory mat region; a plurality of first silicon regions arranged in the memory cell region; a second silicon region arranged in the memory mat end region; a first conductive layer provided in the memory cell region and the memory mat end region; and wherein upper surface position of the second silicon region in the memory mat end region is higher than the upper surface position of the first silicon region in the memory cell region; and wherein the upper surface position of the first conductive layer in the memory mat end region is higher than the upper surface position of the first conductive layer in the memory cell region.

16 Claims, 25 Drawing Sheets

SEMICONDUCTOR MEMORY DEVICE AND METHOD OF FORMING THE SAME

BACKGROUND

Recently, in semiconductor memory devices such as dynamic random access memory (hereinafter referred to as DRAM), a trench gate structure is being adopted as the structure of transistors in the memory cells. In word lines with a trench gate structure, the device is miniaturized further, the repeating pitch of the word lines shrinks and the aspect ratio also increases, and consequently, forming uniform recesses is becoming physically difficult.

BRIEF DESCRIPTION OF THE DRAWINGS

FIG. 3A is a plan view illustrating a diagrammatic configuration of a memory cell region in an exemplary process stage. FIGS. 3B and 3C are longitudinal sections illustrating a diagrammatic configuration of a memory cell region in an exemplary process stage. FIG. 3B is a longitudinal section illustrating a diagrammatic configuration of the portion along the line E-E in FIG. 2, and more specifically is a longitudinal section illustrating a diagrammatic configuration in a direction parallel to a word line of the memory cell region. FIG. 3C is a longitudinal section illustrating a diagrammatic configuration of the portion along the line F-F in FIG. 2, and more specifically is a longitudinal section illustrating a diagrammatic configuration in a direction parallel to a bit line of the memory cell region.

FIG. 4A is a plan view illustrating a diagrammatic configuration of a memory cell region. FIGS. 4B and 4C are longitudinal sections illustrating a diagrammatic configuration of a memory cell region. FIG. 4B is a longitudinal section illustrating a diagram of the portion along the line E-E in FIG. 2, and more specifically is a longitudinal section illustrating a diagrammatic configuration in a direction parallel to a word line of the memory cell region. FIG. 4C is a longitudinal section illustrating a diagram of the portion along the line F-F in FIG. 2, and more specifically is a longitudinal section illustrating a diagrammatic configuration in a direction parallel to a bit line of the memory cell region.

FIG. 5A is a plan view illustrating a diagrammatic configuration of a memory cell region. FIGS. 5B and 5C are longitudinal sections illustrating a diagrammatic configuration of a memory cell region. FIG. 5B is a longitudinal section illustrating a diagram of the portion along the line E-E in FIG. 2, and more specifically is a longitudinal section illustrating a diagrammatic configuration in a direction parallel to a word line of the memory cell region. FIG. 5C is a longitudinal section illustrating a configuration of the portion along the line F-F in FIG. 2, and more specifically is a longitudinal section illustrating a diagrammatic configuration in a direction parallel to a bit line of the memory cell region.

FIG. 6A is a plan view illustrating a diagrammatic configuration of a memory cell region. FIGS. 6B and 6C are longitudinal sections illustrating a diagrammatic configuration of a memory cell region. FIG. 6B is a longitudinal section illustrating a diagram of the portion along the line E-E in FIG. 2, and more specifically is a longitudinal section illustrating a diagrammatic configuration in a direction parallel to a word line of the memory cell region. FIG. 6C is a longitudinal section illustrating a diagram of the portion along the line F-F in FIG. 2, and more specifically is a longitudinal section illustrating a diagrammatic configuration in a direction parallel to a bit line of the memory cell region.

FIGS. 7A and 7B are diagrams illustrating a diagrammatic configuration of a memory cell region in a memory mat end region B illustrated in FIG. 1B. The memory mat end region B is disposed on an opposite side in a word line direction D from the memory mat end region A. FIG. 7A is a plan view illustrating a diagrammatic configuration corresponding to FIG. 6A, and FIG. 7B is a longitudinal section illustrating a diagrammatic configuration corresponding to FIG. 6B.

FIG. 8A is a plan view illustrating a diagrammatic configuration of a memory cell region in an exemplary process stage. FIG. 8B is a longitudinal section illustrating a diagrammatic configuration of a memory cell region in an exemplary process stage. FIG. 8B is a longitudinal section illustrating a diagram of the portion along the line E-E in FIG. 2, and more specifically is a longitudinal section illustrating a diagrammatic configuration in a direction parallel to a word line of the memory cell region.

FIGS. 9A and 9S are diagrams illustrating a method of manufacturing the semiconductor memory device according to the second embodiment, and illustrate schematic views in an exemplary process stage following FIGS. 8A and 8B. FIG. 9A is a plan view illustrating a diagrammatic configuration of a memory cell region. FIG. 9B is a longitudinal section illustrating a diagram of the portion along the line E-E in FIG. 2, and more specifically is a longitudinal section illustrating a diagrammatic configuration in a direction parallel to a word line of the memory cell region.

FIG. 10A is a plan view illustrating a diagrammatic configuration of a memory cell region. FIG. 10B is a longitudinal section illustrating a diagrammatic configuration of a memory cell region. FIG. 10B is a longitudinal section illustrating a diagram of the portion along the line E-E in FIG. 2, and more specifically is a longitudinal section illustrating a diagrammatic configuration in a direction parallel to a word line of the memory cell region.

FIG. 11A is a plan view illustrating a diagrammatic configuration of a memory cell region. FIG. 11B is a longitudinal section illustrating a diagrammatic configuration of a memory cell region. FIG. 11B is a longitudinal section illustrating a diagram of the portion along the line E-E in FIG. 2, and more specifically is a longitudinal section illustrating a diagrammatic configuration in a direction parallel to a word line of the memory cell region.

FIG. 12A is a plan view illustrating a diagrammatic configuration of a memory cell region. FIG. 12B is a longitudinal section illustrating a diagrammatic configuration of a memory cell region. FIG. 12B is a longitudinal section illustrating a diagram of the portion along the line E-E in FIG. 2, and more specifically is a longitudinal section illustrating a diagrammatic configuration in a direction parallel to a word line of the memory cell region.

FIG. 13A is a plan view illustrating a diagrammatic configuration of a memory cell region. FIG. 13B is a longitudinal section illustrating a diagrammatic configuration of a memory cell region. FIG. 13B is a longitudinal section illustrating a diagram of the portion along the line E-E in FIG. 2, and more specifically is a longitudinal section illustrating a diagrammatic configuration in a direction parallel to a word line of the memory cell region.

FIGS. 14A and 14B are diagrams illustrating a diagrammatic configuration of a memory cell region in a memory mat end region B illustrated in FIG. 1B. The memory mat end region B is disposed on an opposite side in a word line direction D from the memory mat end region A. FIG. 14A is a plan view illustrating a diagrammatic configuration corresponding to FIG. 13A, and FIG. 14B is a longitudinal section illustrating a diagrammatic configuration corresponding to FIG. 13B.

FIG. 15A is a plan view illustrating a diagrammatic configuration of a memory cell region in an exemplary process stage. FIG. 15B is a longitudinal section illustrating a diagrammatic configuration of a memory cell region in an exemplary process stage. FIG. 15B is a longitudinal section illustrating a diagram of the portion along the line E-E in FIG. 2, and more specifically is a longitudinal section illustrating a diagrammatic configuration in a direction parallel to a word line of the memory cell region.

FIG. 16A is a plan view illustrating a diagrammatic configuration of a memory cell region. FIG. 16B is a longitudinal section illustrating a diagrammatic configuration of a memory cell region. FIG. 16B is a longitudinal section illustrating a diagram of the portion along the line E-E in FIG. 2, and more specifically is a longitudinal section illustrating a diagrammatic configuration in a direction parallel to a word line of the memory cell region.

FIG. 17A is a plan view illustrating a diagrammatic configuration of a memory cell region. FIG. 17B is a longitudinal section illustrating a diagrammatic configuration of a memory cell region. FIG. 17B is a longitudinal section illustrating a diagram of the portion along the line E-E in FIG. 2, and more specifically is a longitudinal section illustrating a diagrammatic configuration in a direction parallel to a word line of the memory cell region.

FIG. 18A is a plan view illustrating a diagrammatic configuration of a memory cell region. FIG. 18B is a longitudinal section illustrating a diagrammatic configuration of a memory cell region. FIG. 18B is a longitudinal section illustrating a diagram of the portion along the line E-E in FIG. 2, and more specifically is a longitudinal section illustrating a diagrammatic configuration in a direction parallel to a word line of the memory cell region.

FIG. 19A is a plan view illustrating a diagrammatic configuration of a memory cell region. FIG. 19B is a longitudinal section illustrating a diagrammatic configuration of a memory cell region. FIG. 19B is a longitudinal section illustrating a diagram of the portion along the line E-E in FIG. 2, and more specifically is a longitudinal section illustrating a diagrammatic configuration in a direction parallel to a word line of the memory cell region.

FIG. 20A is a plan view illustrating a diagrammatic configuration of a memory cell region. FIG. 20B is a longitudinal section illustrating a diagrammatic configuration of a memory cell region. FIG. 20B is a longitudinal section illustrating a diagram of the portion along the line E-E in FIG. 2, and more specifically is a longitudinal section illustrating a diagrammatic configuration in a direction parallel to a word line of the memory cell region.

FIG. 21A is a plan view illustrating a diagrammatic configuration of a memory cell region. FIG. 21B is a longitudinal section illustrating a diagrammatic configuration of a memory cell region. FIG. 21B is a longitudinal section illustrating a diagram of the portion along the line E-E in FIG. 2, and more specifically is a longitudinal section illustrating a diagrammatic configuration in a direction parallel to a word line of the memory cell region.

FIG. 22A is a plan view illustrating a diagrammatic configuration of a memory cell region. FIG. 22B is a longitudinal section illustrating a diagrammatic configuration of a memory cell region. FIG. 22B is a longitudinal section illustrating a diagram of the portion along the line E-E in FIG. 2, and more specifically is a longitudinal section illustrating a diagrammatic configuration in a direction parallel to a word line of the memory cell region.

FIG. 23A is a plan view illustrating a diagrammatic configuration of a memory cell region. FIG. 23B is a longitudinal section illustrating a diagrammatic configuration of a memory cell region. FIG. 23B is a longitudinal section illustrating a diagram of the portion along the line E-E in FIG. 2, and more specifically is a longitudinal section illustrating a diagrammatic configuration in a direction parallel to a word line of the memory cell region.

FIGS. 24A and 24B are diagrams illustrating a diagrammatic configuration of a memory cell region in a memory mat end region B illustrated in FIG. 1B. The memory mat end region B is disposed on an opposite side in a word line direction D from the memory mat end region A. FIG. 24A is a plan view illustrating a diagrammatic configuration corresponding to FIG. 23A, and FIG. 24B is a longitudinal section illustrating a diagrammatic configuration corresponding to FIG. 23B.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 25:
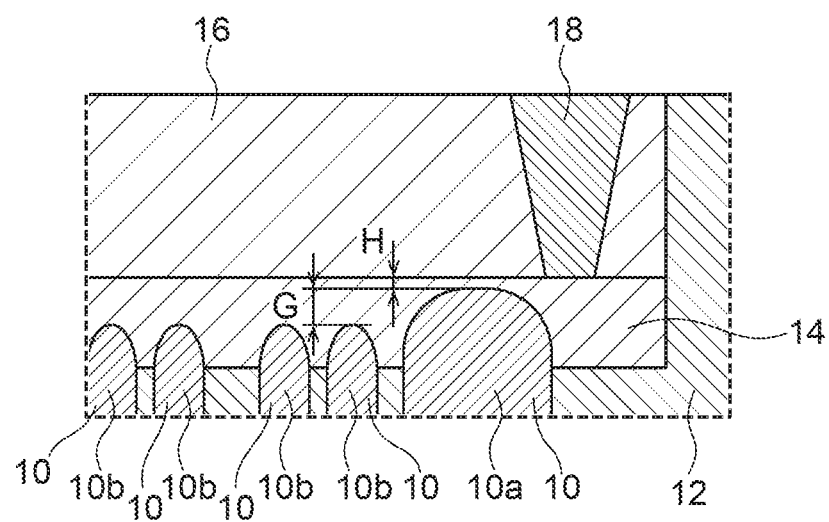
FIG. 25 is a diagram for reference for a semiconductor memory device and a method of manufacturing the same according to the first to third embodiments, is a longitudinal section illustrating a diagram of the portion along the line E-E in FIG. 2, and more specifically is a longitudinal section illustrating a diagrammatic configuration in a direction parallel to a word line of the memory cell region.

FIG. 25 is a longitudinal section illustrating a general configuration of a semiconductor memory device. Note that FIG. 25 is provided by way of reference for the description below.

As illustrated in FIG. 25, when a trench for forming an isolation region 12 is formed on a semiconductor substrate, an upper position of an end silicon region 10a at the end of a memory cell mat is formed higher than the upper position of an active silicon region 10b by a difference G. The thickness of a first conductive layer 14 is set to a thickness allowing the first conductive layer 14 to be buried inside a recess in the trench gate. For this reason, in some cases, the thickness H of the first conductive layer 14 formed above the end silicon region 10a is extremely thin. During a heat treatment applied later, if crystal growth occurs in the metal forming the first conductive layer 14, the gate metal above the end silicon region 10a may have openings and become discontinuous, and in some cases electrical disconnection may occur in the first conductive layer 14 that forms a word line.

Also, because a word line contact 18 for the word line is coming to have a higher aspect ratio, hole processing is also becoming difficult. For this reason, in some cases, the word line contact 18 may not be fully open, and poor connectivity may occur.

Hereinafter, semiconductor memory devices 1A, 1B, and 1C according to a plurality of embodiments and methods of manufacturing the same will be described with reference to the drawings. In the following description, DRAM is given as an example of the semiconductor memory devices 1A, 1B, and 1C. Note that FIGS. 1A, 1B, and 2 will be referenced in the description of the first embodiment, the second embodiment, and the third embodiment described later.

First Embodiment

Hereinafter, the semiconductor memory device 1A and a method of manufacturing the same according to the first embodiment will be described with reference to FIGS. 1A to 14B.

Figure 1A:
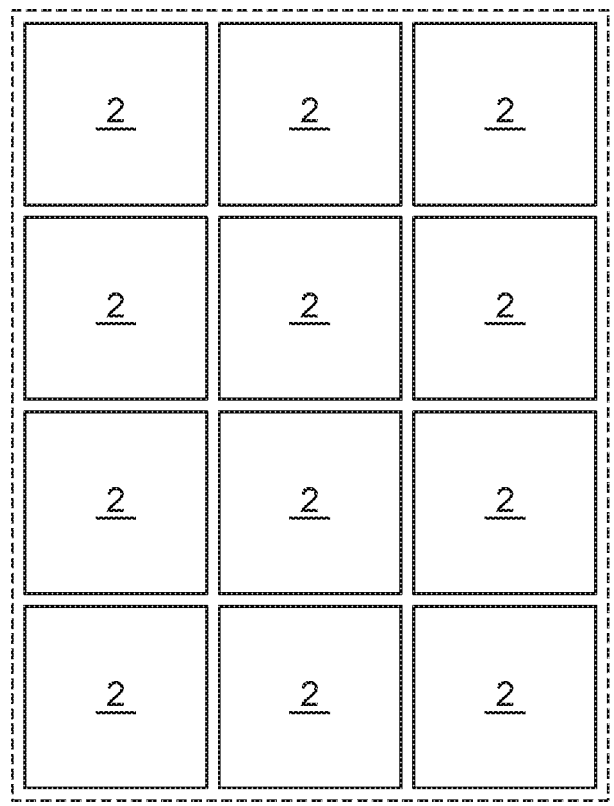
FIG. 1A is a plan view illustrating a diagrammatic configuration of part of a memory cell region of a semiconductor memory device according to an embodiment.
Figure 1B:
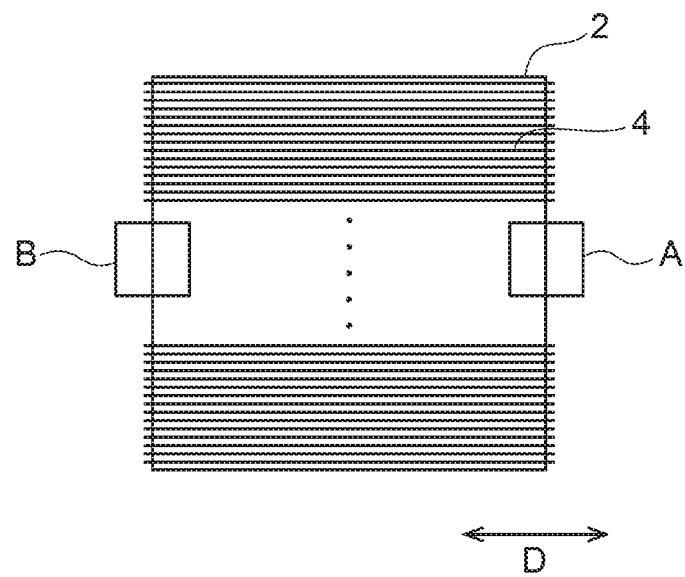
FIG. 1B is a plan view illustrating a diagrammatic configuration of a memory mat.
Figure 2:
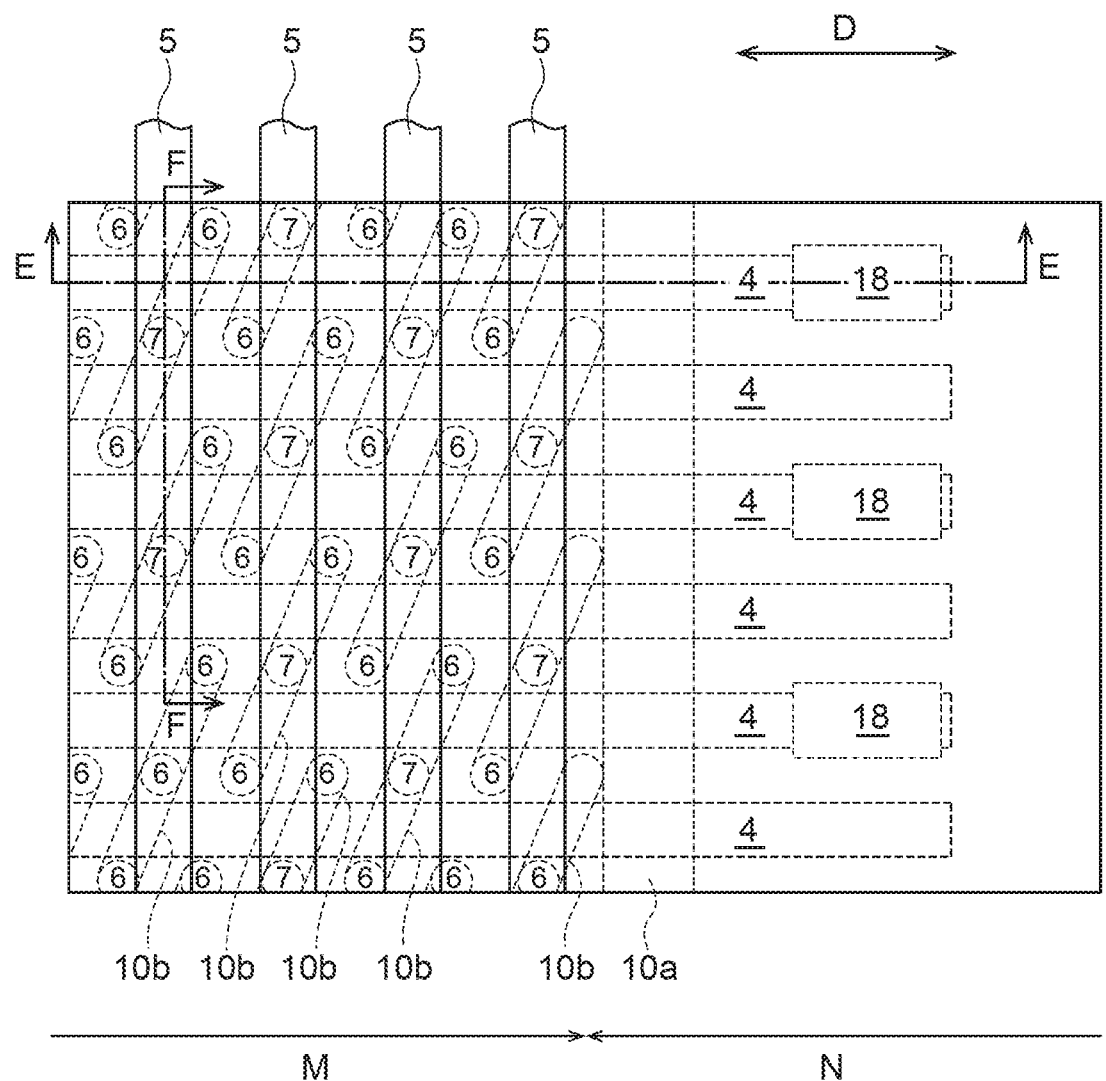
FIG. 2 is a plan-view layout illustrating a diagrammatic configuration of the memory cell region of the semiconductor memory device according to an embodiment, and is an enlarged view of the memory mat end region A in FIG. 1B.

FIGS. 1A, 1B, and 2 are diagrams illustrating a plan-view layout of the semiconductor memory device 1A according to the first embodiment. As illustrated in FIG. 1A, the semiconductor memory device 1A is provided with a plurality of memory mats 2. As illustrated in FIG. 1B, a plurality of word lines 4 are disposed in parallel on each memory mat 2. The end of each word line 4 is connected to a row decoder not illustrated. Herein, the direction parallel to the word lines 4 is referred to as the word line direction D. A memory mat end region A and a memory mat end region B are disposed at the ends in the word line direction D of each memory mat 2.

FIG. 2 is an enlarged layout view of the memory mat end region A in FIG. 1B. As illustrated in FIG. 2, in the memory mat end region A, the semiconductor memory device 1A is provided with a memory cell region N and a memory mat end region N. In the memory cell region N, a plurality of word lines 4 and a plurality of bit lines 5 are disposed orthogonally at equal pitch. Active silicon regions 10b forming memory cells are disposed at the intersection points between the word lines 4 and the bit lines 5. The active silicon regions 10b may be referred to as the "first silicon region" in some embodiments.

The longitudinal direction of the active silicon regions 10b is inclined a predetermined angle with respect to the bit lines 5. The word lines 4 function as the gate electrode of an access transistor of the memory cells in the active silicon regions 10b. The bit lines 5 are connected to a central part of the active silicon regions 10b through bit line contacts 7. In the active silicon regions 10b, capacitor contacts 6 are disposed on the opposite side of the word lines 4 from the bit line contacts 7. Capacitors not illustrated are connected to the capacitor contacts 6.

In the memory mat end region N, an end silicon region 10a is disposed extending in a direction orthogonal to the word line direction D. The end silicon region 10a may be referred to as the "second silicon region" in some embodiments. The word lines 4 are drawn out to the memory mat end region N, and contacts 18 electrically connected to the word lines 4 are provided. The plurality of active silicon regions 10b adjacent to the end silicon region 10a may be treated as dummy regions where non-functional memory cells are formed.

Next, FIGS. 3A to 7B will be referenced to describe the semiconductor memory device 1A and a method of manufacturing the same according to the first embodiment.

Figure 3A:
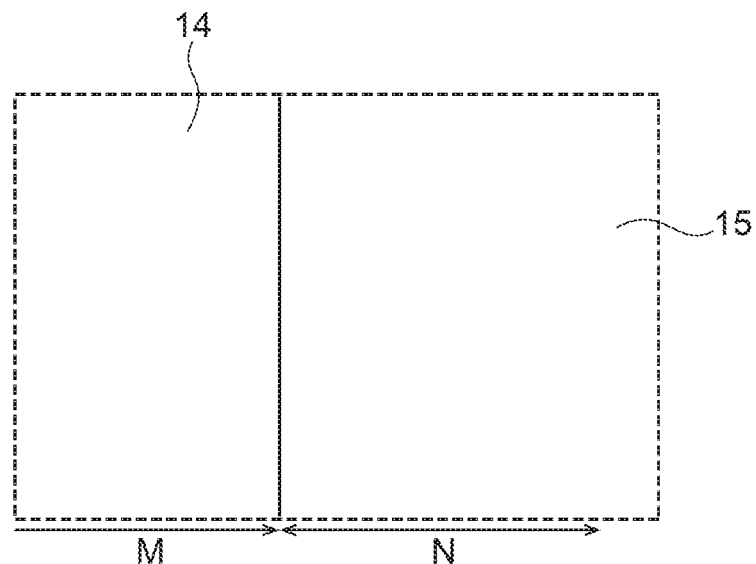
FIGS. 3A, 3B, and 3C are diagrams illustrating a method of manufacturing a semiconductor memory device according to a first embodiment.
Figure 3B:
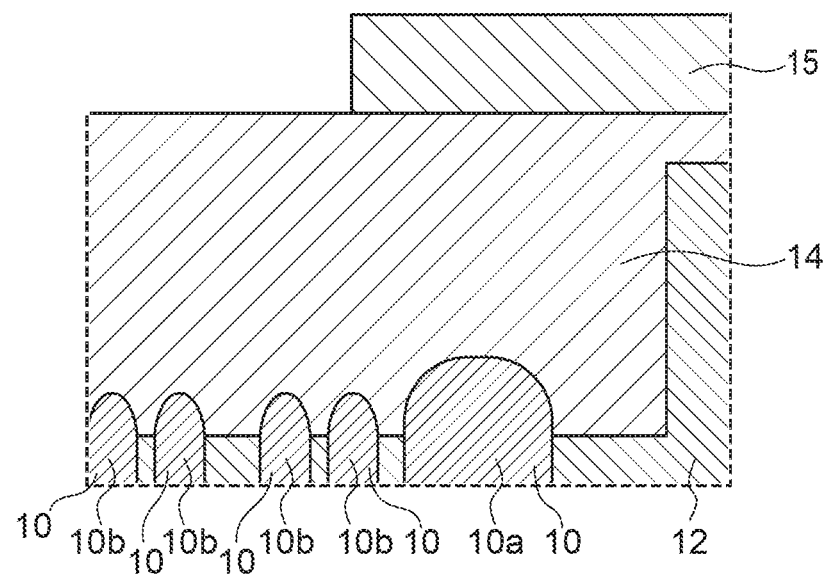
Figure 3C:
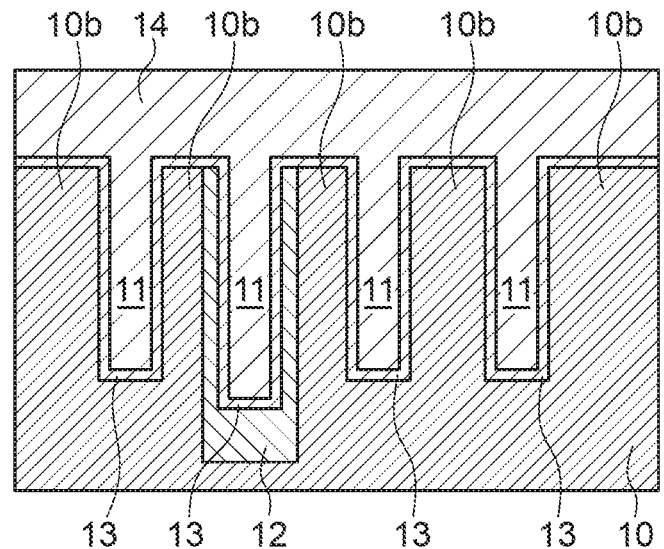

As illustrated in FIGS. 3A, 35, and 3C, an isolation region 12 that partitions element regions is formed on a semiconductor substrate 10, and thereafter, recesses 11 for burying components such as a first conductive layer 14 later are formed. In the isolation region 12, a shallow trench isolation containing an insulating film buried in a trench formed in the semiconductor substrate 10 is formed, for example.

The active silicon regions 10b and the end silicon region 10a are demarcated by the isolation region 12. The isolation region 12 is formed by forming a recess in the semiconductor substrate 10 using known lithography technology and anisotropic dry etching technology, and burying an insulating film such as a silicon oxide film for example inside the recess.

The recesses 11 are formed by etching the semiconductor substrate 10 using known lithography technology and anisotropic dry etching technology. After that, a gate insulating film 13 is formed on the surface of the recesses 11, and the first conductive layer 14 is formed. Next, known lithography technology is used to form a photoresist 15 on the memory mat end region N. The photoresist 15 is not formed in the memory cell region M.

The gate insulating film 13 includes an insulating film such as silicon oxide film ($SiO_2$) for example. The first conductive layer 14 includes a metal compound such as titanium nitride (TiN) for example. The first conductive layer 14 is formed by chemical vapor deposition (hereinafter referred to as CVD) for example.

Figure 4A:
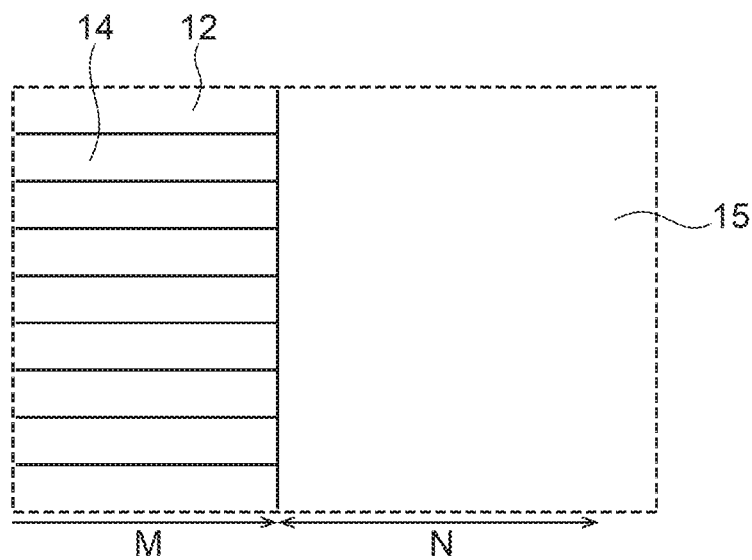
FIGS. 4A, 4B, and 4C are diagrams illustrating a method of manufacturing the semiconductor memory device according to the first embodiment, and illustrate schematic views in an exemplary process stage following FIGS. 3A, 3B, and 3C.
Figure 4B:
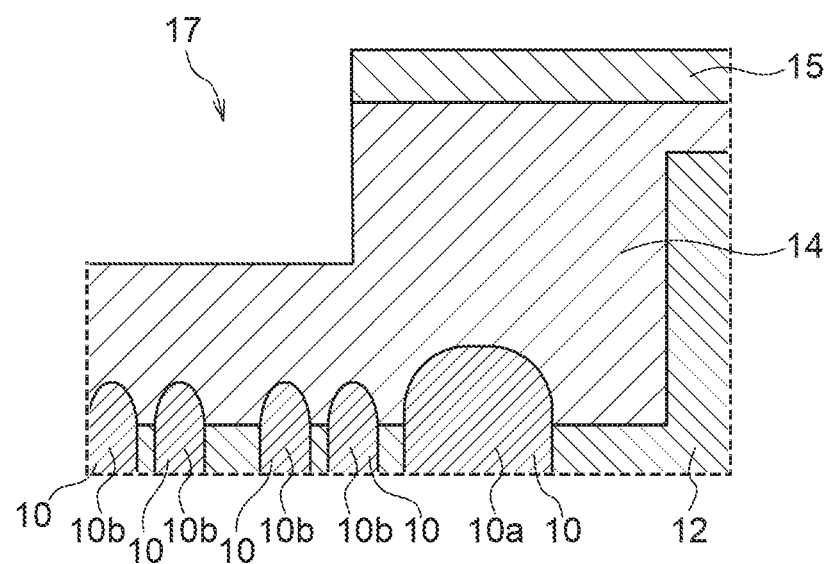
Figure 4C:
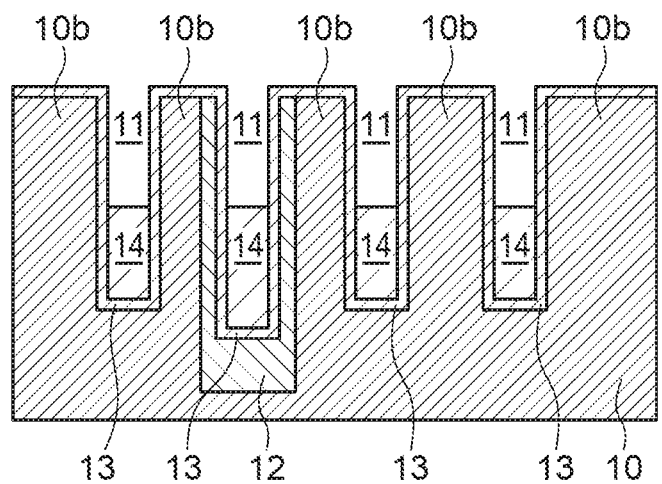

Next, as illustrated in FIGS. 4A, 4B, and 4C, anisotropic dry etching is performed on the first conductive layer 14 of the memory cell region M using the photoresist 15 as a mask, and the thickness of the first conductive layer 14 is decreased. With this arrangement, as illustrated in FIG. 4B, a depression 17 is formed in the first conductive layer 14 of the memory cell region M.

Figure 5A:
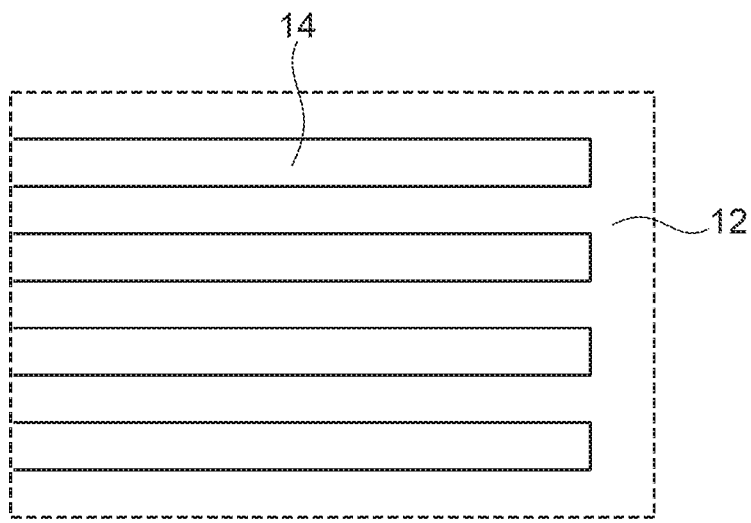
FIGS. 5A, 5B, and 5C are diagrams illustrating a method of manufacturing the semiconductor memory device according to the first embodiment, and illustrate schematic views in an exemplary process stage following FIGS. 4A, 4B, and 4C.
Figure 5B:
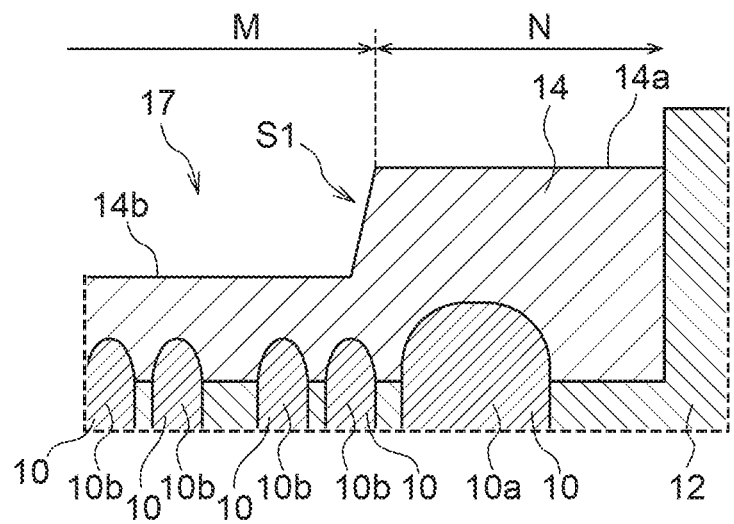
Figure 5C:
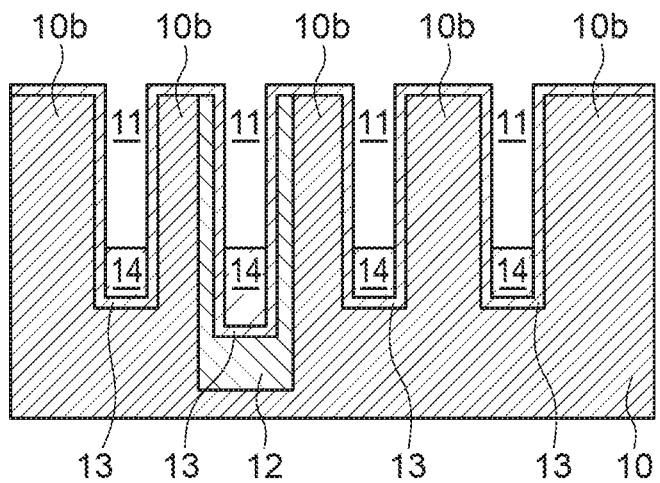

Next, as illustrated in FIGS. 5A, 5B, and 5C, by removing the photoresist 15 and performing anisotropic dry etching on the first conductive layer 14, the first conductive layer 14 is etched back. With this arrangement, the thickness of the first conductive layer 14 in the memory cell region M and the memory mat end region N is decreased. At this time, the thickness of the first conductive layer 14 on the active silicon regions 10b in the memory cell region N is controlled to a predetermined thickness. The amount of etch-back of the first conductive layer 14 is controlled by controlling the duration of the anisotropic dry etching, for example.

At this time, as illustrated in FIG. 5B, an upper surface position 14a of the first conductive layer 14 in the memory mat end region N is higher than an upper position 14b of the first conductive layer 14 in the memory cell region M. Also, a step S1 is formed between the upper surface position 14a and the upper position 14b at the boundary between the memory cell region N and the memory mat end region N. Also, the height difference between the upper surface position 14a and the upper position 14b, or in other words the height of the step S1, is controlled by controlling the duration of the anisotropic dry etching in the step illustrated in FIGS. 4A, 4B, and 4C, or in other words the step of performing anisotropic dry etching on the first conductive layer 14 of the memory cell region N using the photoresist 15 as a mask.

Figure 6A:
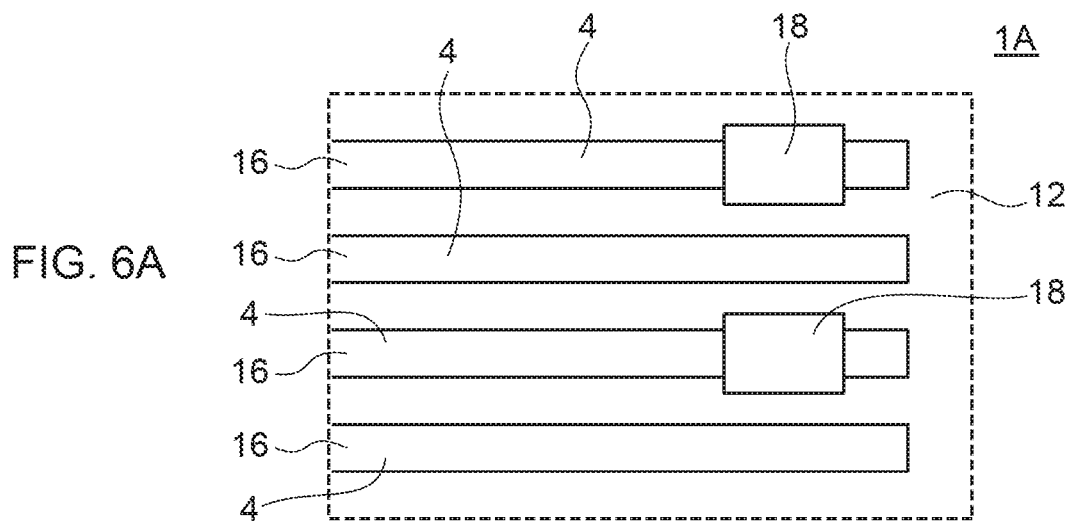
FIGS. 6A, 6B, and 6C are diagrams illustrating a semiconductor memory device and a method of manufacturing the same according to the first embodiment, and illustrate schematic views in an exemplary process stage following FIGS. 5A, 5B, and 5C.
Figure 6B:
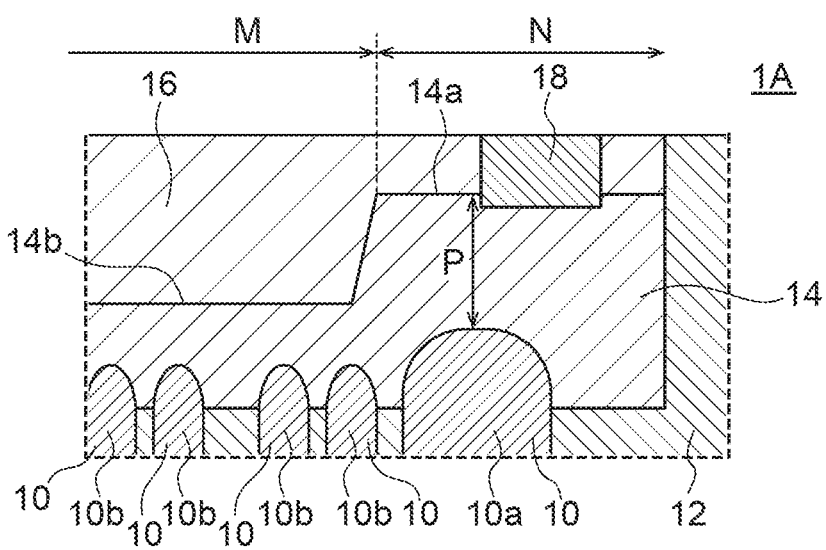
Figure 6C:
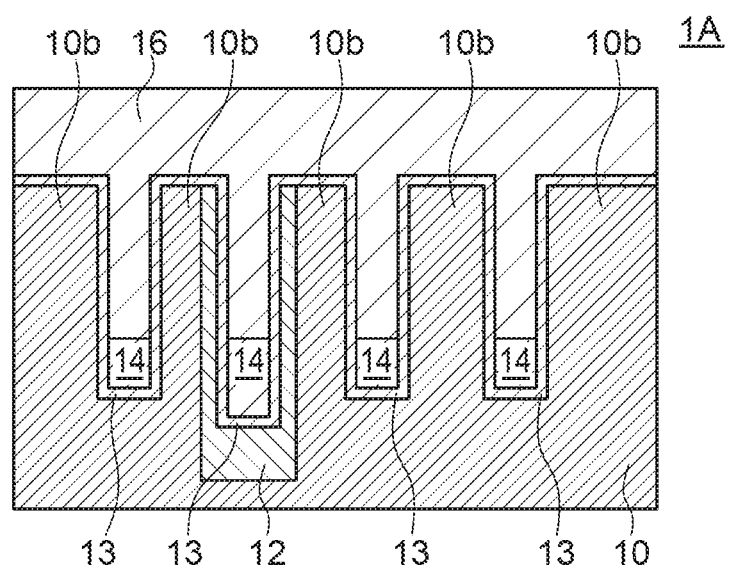

Next, as illustrated in FIGS. 6A, 6B, and 6C, a cap fill layer 16 is formed, and the contact 18 that penetrates through the cap fill layer 16 and reaches the upper surface of the first conductive layer 14 is formed in the memory mat end region N.

The cap fill layer 16 includes an insulating film such as a silicon oxide film for example. The cap fill layer 16 can be formed by CVD, for example. After forming the cap fill layer 16, a step of flattening the surface by using chemical mechanical polishing (hereinafter referred to as CMP) may also be performed.

Figure 7A:
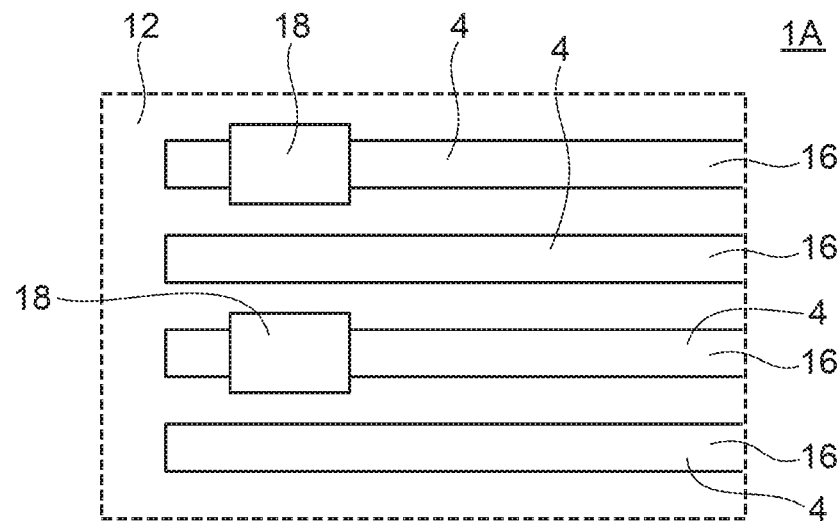
FIGS. 7A and 7B are diagrams illustrating a semiconductor memory device and a method of manufacturing the same according to the first embodiment, and are schematic views in the same process stage as FIGS. 6A, 6B, and 6C.
Figure 7B:
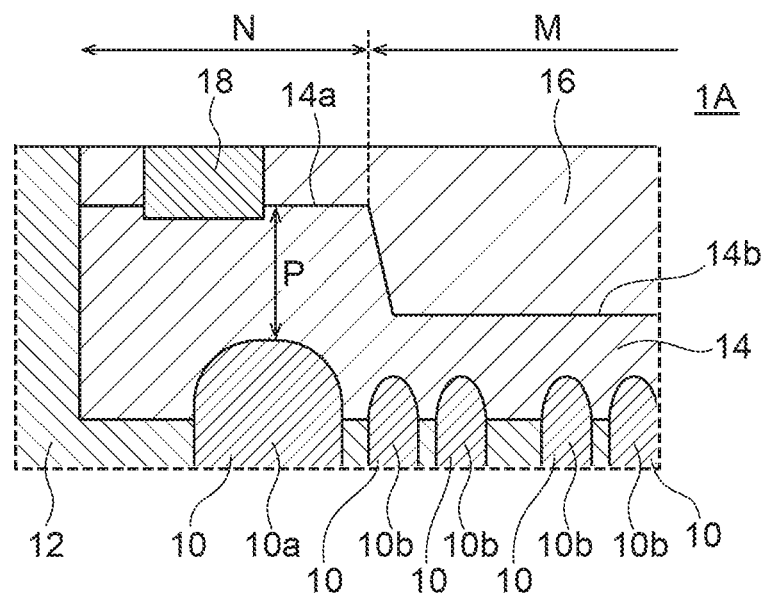

FIGS. 7A and 7B are diagrams illustrating a diagrammatic configuration of a memory cell region in the memory mat end region A in FIG. 2 and in a memory mat end region B on the opposite side in the word line direction D. FIGS. 7A and 7B are schematic views in the same process stage as FIGS. 6A and 6B, and illustrate a configuration that is the mirror reflection of the configuration illustrated in FIGS. 6A and 6B. FIG. 7A is a plan view illustrating a diagrammatic configuration of a memory cell region. FIG. 7B is a longitudinal section illustrating a diagrammatic configuration of a memory cell region.

In FIGS. 6B and 7B, a thickness P of the first conductive layer 14 on the end silicon region 10a can be formed thicker than the thickness of the first conductive layer 14 on the active silicon regions 10b. Also, the first conductive layer 14 on the end silicon region 10a is provided with a sufficient thickness P as illustrated in FIGS. 6B and 7B.

Through the above steps, the semiconductor memory device 1A according to the first embodiment can be completed.

According to the semiconductor memory device 1A and the method of manufacturing the same according to the first embodiment, the upper surface position 14a of the first conductive layer 14 on the end silicon region 10a can be made higher than the upper position 14b on the active silicon regions 10b. With this arrangement, a thinner cap fill layer 16 can be formed, and therefore the aspect ratio of the contact 18 that penetrates through the cap fill layer 16 and reaches the upper surface of the first conductive layer 14 can be reduced. Also, this arrangement makes it possible to suppress a situation in which an opening is not formed and the contact 18 does not fully penetrate the cap fill layer 16 to reach the upper surface of the first conductive layer 14.

Also, according to the semiconductor memory device 1A and the method of manufacturing the same according to the first embodiment, the thickness P of the first conductive layer 14 on the end silicon region 10a can be made thicker than the thickness of the first conductive layer 14 on the active silicon regions 10b. Consequently, as illustrated in FIGS. 6B and 7B, because the first conductive layer 14 on the end silicon region 10a is provided with a sufficient thickness P, the occurrence of electrical disconnection in the first conductive layer 14 can be suppressed even if metal crystal growth occurs.

Second Embodiment

Next, FIGS. 1A and 1B, FIG. 2, and FIGS. 8A to 14B will be referenced to describe the semiconductor memory device 1B and a method of manufacturing the same according to the second embodiment. In the description of the semiconductor memory device 1B and the method of manufacturing the same according to the second embodiment, a longitudinal section in the direction parallel to the bit lines 5, or in other words a diagram corresponding to FIGS. 3C, 4C, 5C, and 6C of the first embodiment, is omitted. Also, in the description of the semiconductor memory device 1B and the method of manufacturing the same according to the second embodiment, the description may be reduced or omitted in some cases by assigning similar signs or similar names to parts of the configuration that are similar to the first embodiment.

Figure 8A:
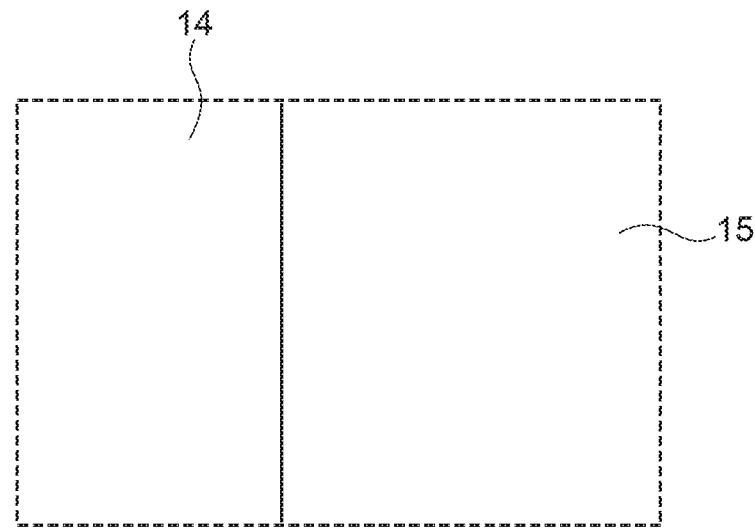
FIGS. 8A and 8B are diagrams illustrating a method of manufacturing a semiconductor memory device according to a second embodiment.
Figure 8B:
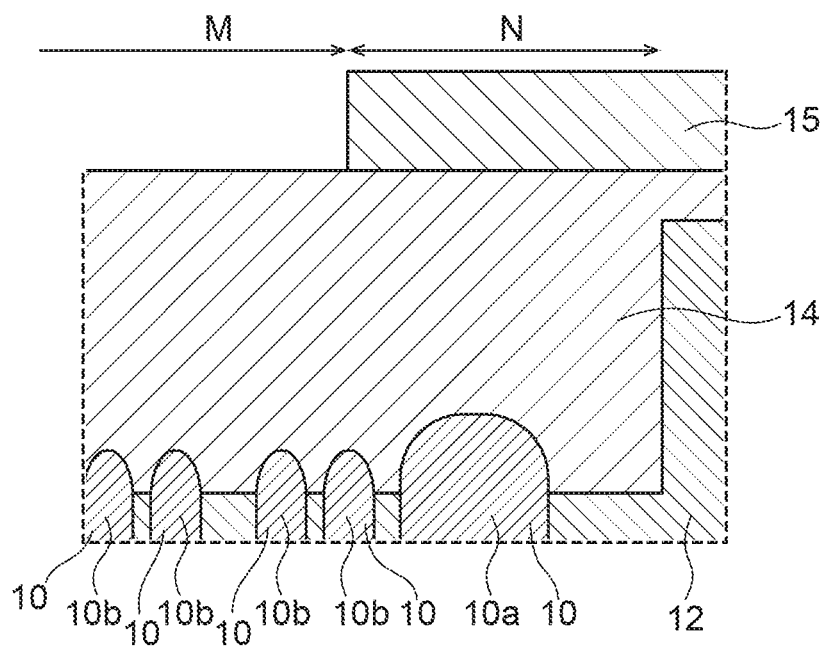
Figure 9A:
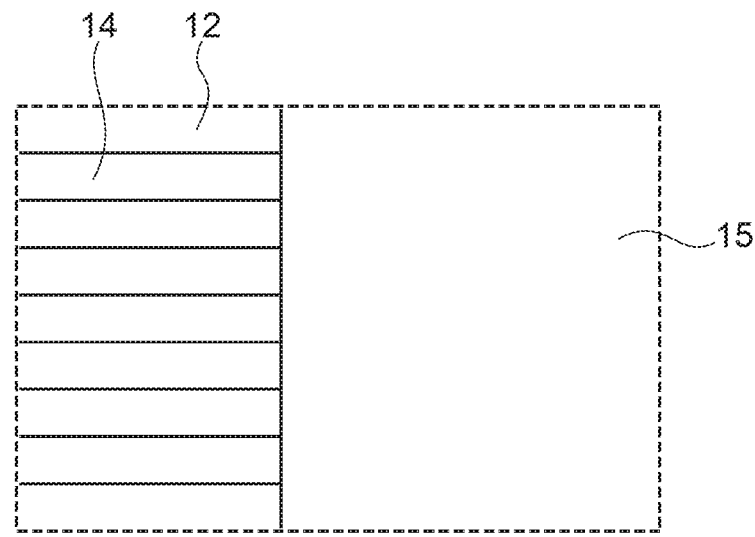
Figure 9B:
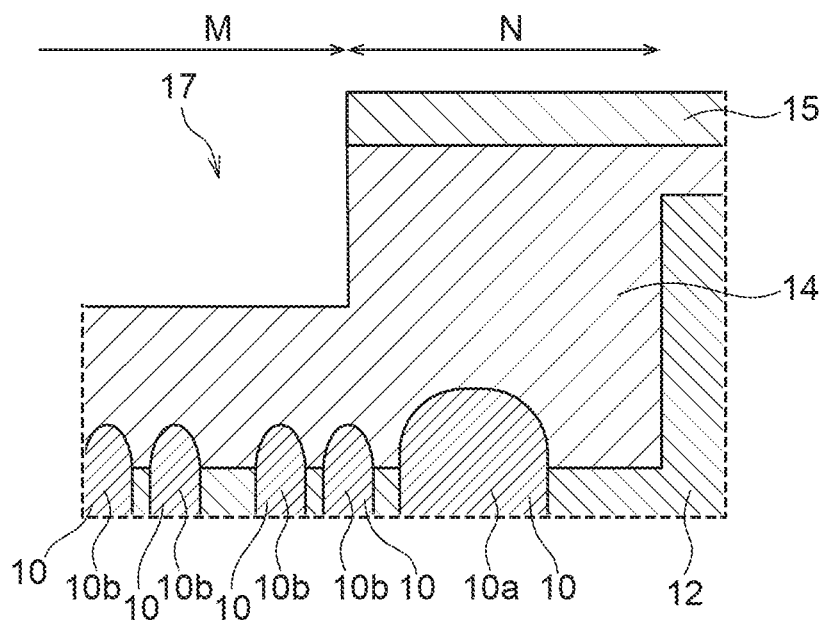
FIG. 9B is a longitudinal section illustrating a diagrammatic configuration of a memory cell region.

First, as illustrated in FIGS. 8A and 8B, a step similar to the step described using FIGS. 3A, 3B, and 3C in the first embodiment is performed. Next, as illustrated in FIGS. 9A and 9B, anisotropic dry etching is performed on the first conductive layer 14 of the memory cell region N using the photoresist 15 as a mask, and the thickness of the first conductive layer 14 is decreased. With this arrangement, as illustrated in FIG. 9B, the depression 17 is formed in the first conductive layer 14 of the memory cell region M.

Figure 10A:
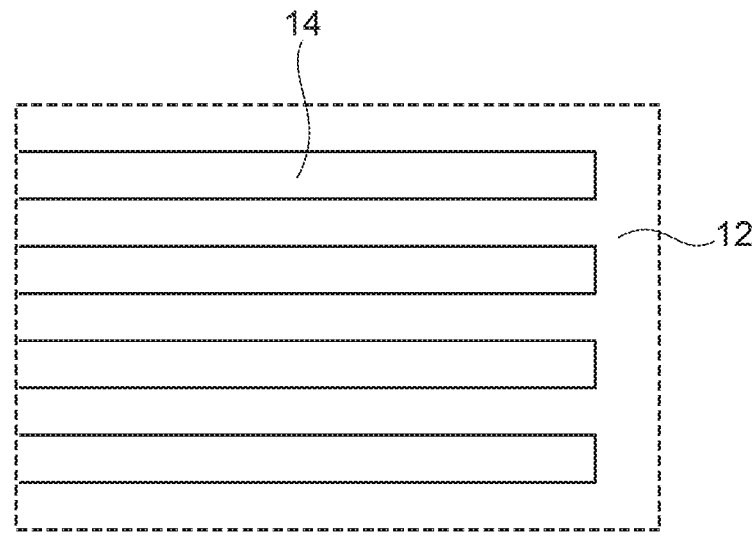
FIGS. 10A and 10B are diagrams illustrating a method of manufacturing the semiconductor memory device according to the second embodiment, and illustrate schematic views in an exemplary process stage following FIGS. 9A and 9B.
Figure 10B:
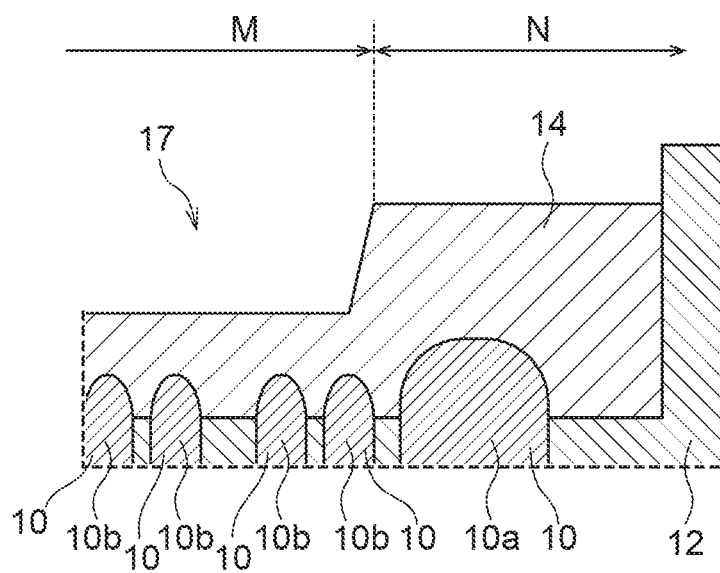

Next, as illustrated in FIGS. 10A and 10B, by removing the photoresist 15 and performing anisotropic dry etching on the first conductive layer 14, the first conductive layer 14 is etched back. With this arrangement, the thickness of the first conductive layer 14 in the memory cell region N and the memory mat end region N is decreased. The amount of etch-back of the first conductive layer 14 is controlled by controlling the duration of the anisotropic dry etching, for example.

Figure 11A:
FIGS. 11A and 11B are diagrams illustrating a method of manufacturing the semiconductor memory device according to the second embodiment, and illustrate schematic views in an exemplary process stage following FIGS. 10A and 10B.
Figure 11B:
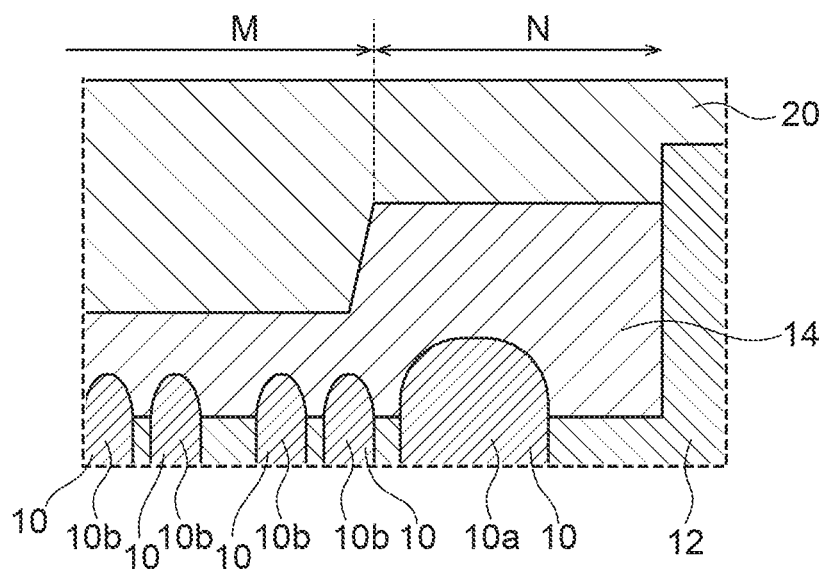

Next, as illustrated in FIGS. 11A and 11B, a second conductive layer 20 is formed on the first conductive layer 14. The second conductive layer 20 includes a material having a lower work function than the first conductive layer 14. The second conductive layer 20 can be formed by CVD or sputtering, for example.

Figure 12A:
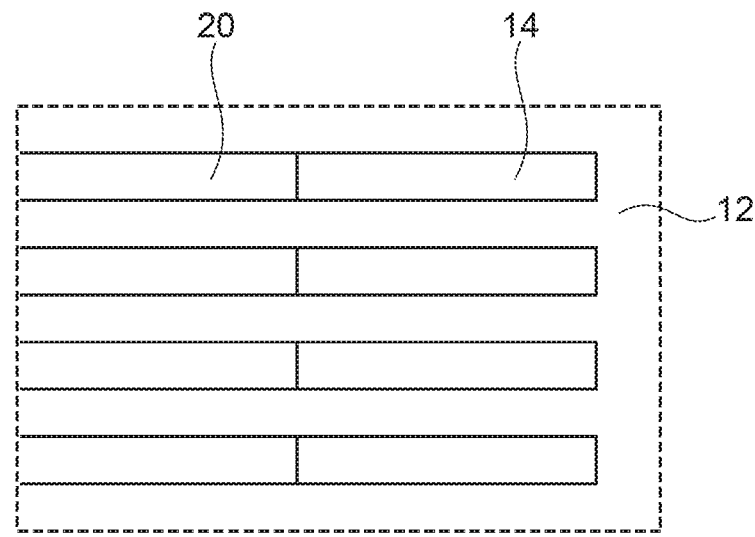
FIGS. 12A and 12B are diagrams illustrating a method of manufacturing the semiconductor memory device according to the second embodiment, and illustrate schematic views in an exemplary process stage following FIGS. 11A and 11B.
Figure 12B:
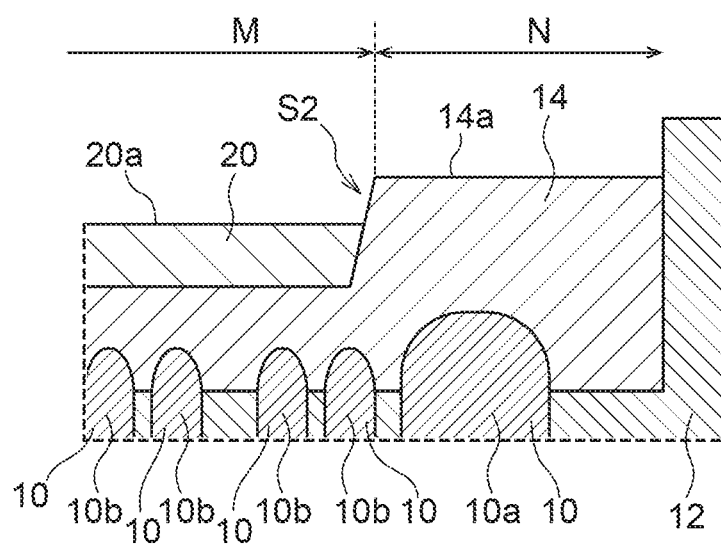

Next, as illustrated in FIGS. 12A and 12B, the second conductive layer 20 is etched back by performing anisotropic dry etching, and the second conductive layer 20 is formed in only the depression 17 formed in FIG. 10B. The anisotropic dry etching is performed under conditions by which the etch rate of the first conductive layer 14 is lower than the etch rate of the second conductive layer 20. In this step, by controlling the duration of the anisotropic dry etching for example, the second conductive layer 20 in the memory mat end region N can be removed, leaving the second conductive layer 20 only in the depression 17 of the memory cell region M.

At this time, the upper surface position 14a of the first conductive layer 14 in the memory mat end region N is higher than an upper position 20a of the second conductive layer 20 in the memory cell region M. Also, a step S2 is formed between the upper surface position 14a and the upper position 20a at the boundary between the memory cell region M and the memory mat end region N. Also, the height difference between the upper surface position 14a and the upper position 20a, or in other words the height of the step S2, is controlled by controlling the duration of the anisotropic dry etching performed on the first conductive layer 14 in the memory cell region M using the photoresist 15 as a mask and the duration of the anisotropic dry etching performed on the second conductive layer 20.

Figure 13A:
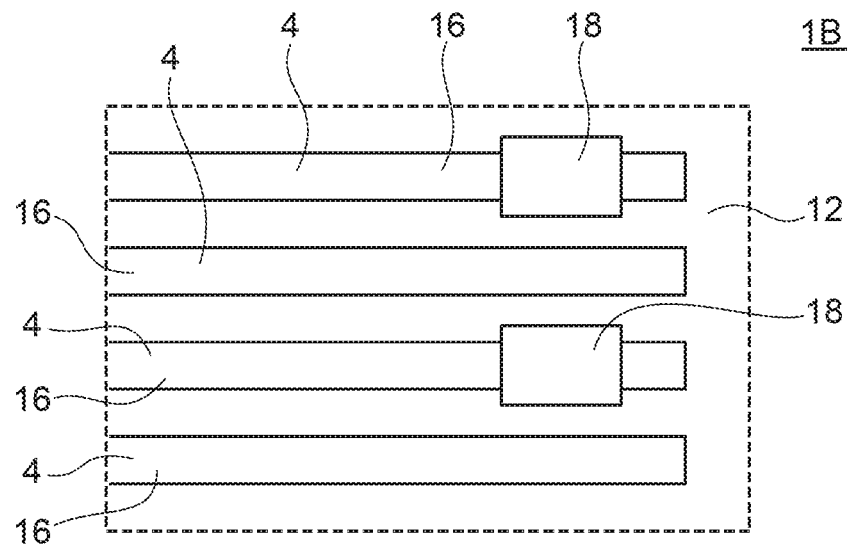
FIGS. 13A and 13B are diagrams illustrating the semiconductor memory device and a method of manufacturing the same according to the second embodiment, and illustrate schematic views in an exemplary process stage following FIGS. 12A and 12B.
Figure 13B:
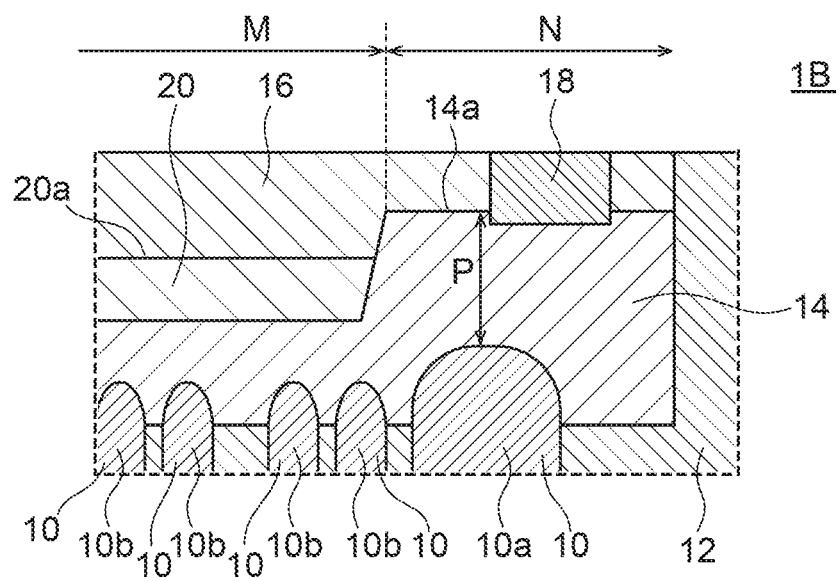

Next, as illustrated in FIGS. 13A and 13B, the cap fill layer 16 is formed, and the contact 18 that penetrates through the cap fill layer 16 and reaches the upper surface of the first conductive layer 14 is formed in the memory mat end region N.

Figure 14A:
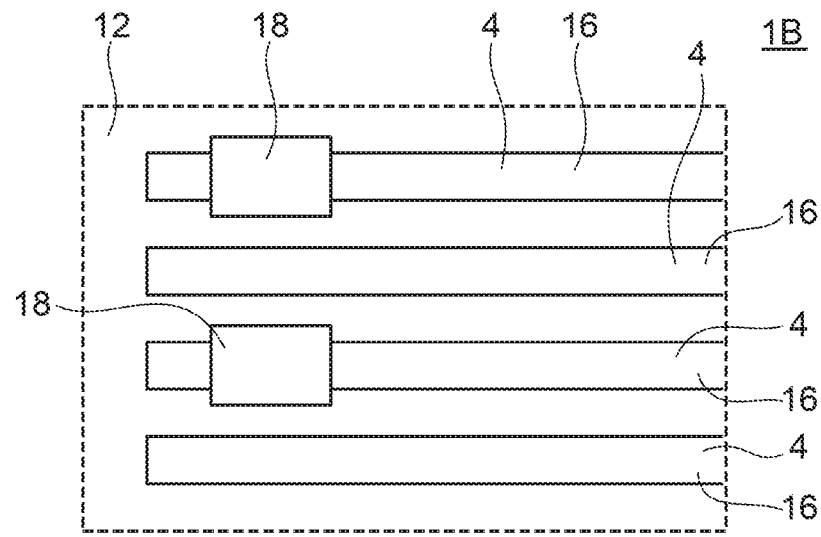
FIGS. 14A and 14B are diagrams illustrating a semiconductor memory device and a method of manufacturing the same according to the second embodiment, and are schematic views in the same process stage as FIGS. 13A and 13B.
Figure 14B:
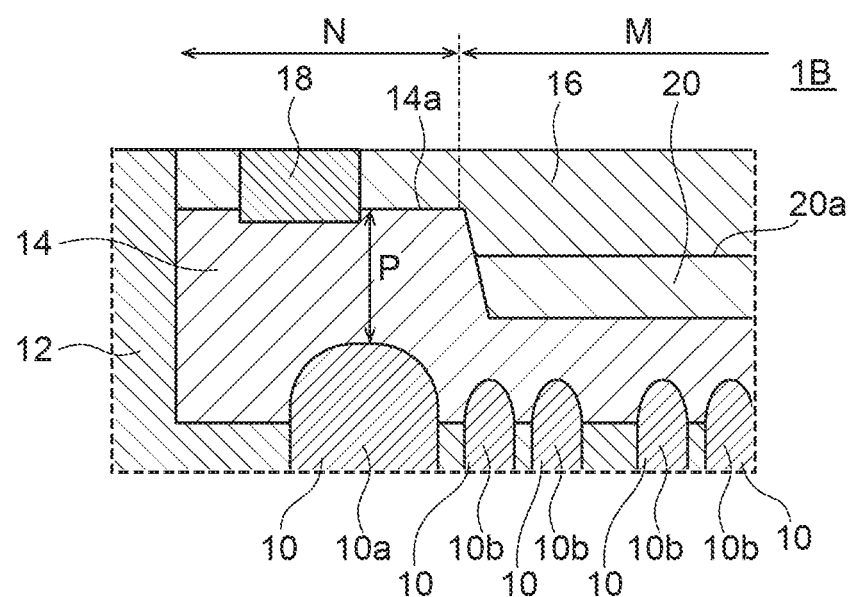

FIGS. 14A and 14B are diagrams illustrating a configuration of the semiconductor memory device 1B in the same step as FIGS. 13A and 13B. FIGS. 14A and 14B are diagrams illustrating a diagrammatic configuration of a memory cell region in the memory mat end region A in FIG. 2 and in a memory mat end region B on the opposite side in the word line direction D. FIGS. 14A and 14B illustrate a configuration that is the mirror reflection of the configuration illustrated in FIGS. 13A and 13B, disposed in the memory mat end region B on the opposite side in the word line direction D from the memory mat end region A.

As illustrated in FIGS. 13B and 14B, a thickness P of the first conductive layer 14 on the end silicon region 10a can be formed thicker than the thickness of the first conductive layer 14 and the second conductive layer 20 on the active silicon regions 10b. Also, the first conductive layer 14 on the end silicon region 10a is provided with a sufficient thickness P as illustrated in FIGS. 13B and 14B.

Through the above steps, the semiconductor memory device 1B according to the second embodiment can be completed.

According to the semiconductor memory device and the method of manufacturing the same according to the second embodiment, effects similar to the first embodiment are obtained. Also, according to the semiconductor memory device and the method of manufacturing the same according to the second embodiment, it is possible to form a gate electrode with the first conductive layer 14 and the second conductive layer 20 having different work functions. More specifically, a configuration in which the first conductive layer 14 having a higher work function than the second conductive layer 20 is disposed below and the second conductive layer 20 having a lower work function than the first conductive layer 14 is disposed above can be achieved. This arrangement makes it possible to relax the electric field near the source-drain of the access transistor provided with the gate electrode including the first conductive layer 14 and the second conductive layer 20. Consequently, because the data writing characteristics and the data retention characteristics of DRAM can be improved, high-performance DRAM can be achieved.

Third Embodiment

Next, FIGS. 1A and 1B, FIG. 2, and FIGS. 15A to 24B will be referenced to describe the semiconductor memory device 1C and a method of manufacturing the same according to the third embodiment. In the description of the semiconductor memory device 1C and the method of manufacturing the same according to the third embodiment, a longitudinal section in the direction parallel to the bit lines 5, or in other words a diagram corresponding to FIGS. 3C, 4C, 5C, and 6C of the first embodiment, is omitted. Also, in the description of the semiconductor memory device 1C and the method of manufacturing the same according to the third embodiment, the description may be omitted in some cases by assigning similar signs or similar names to parts of the configuration that are similar to the first and second embodiments.

Figure 15A:
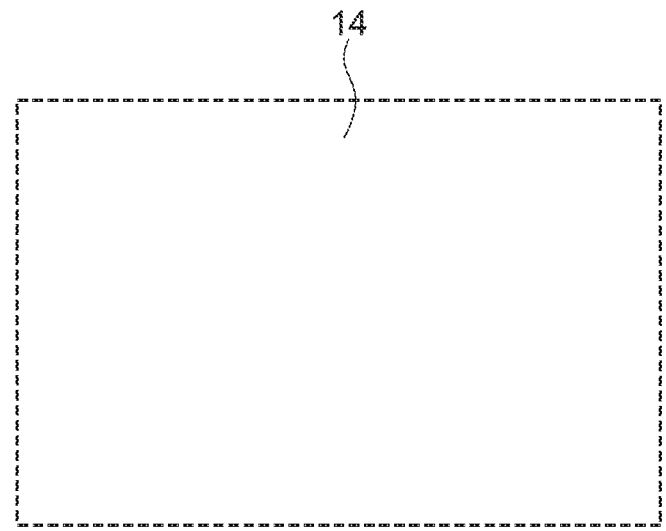
FIGS. 15A and 15B are diagrams illustrating a method of manufacturing a semiconductor memory device according to a third embodiment.
Figure 15B:
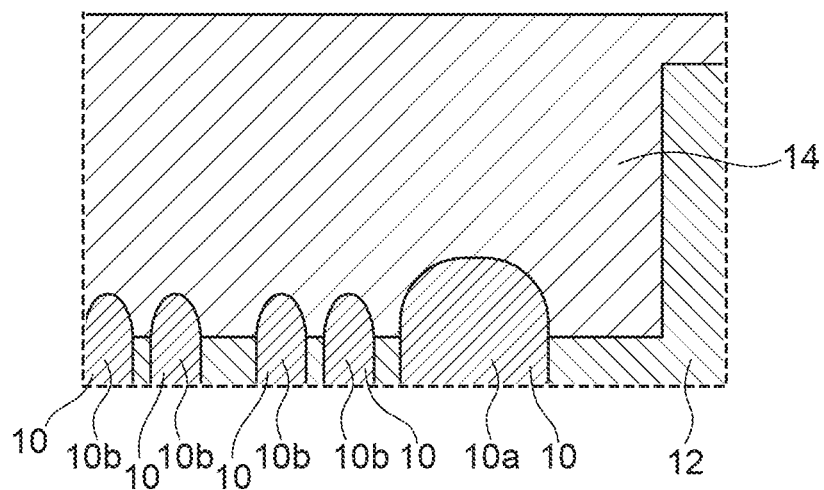

First, as illustrated in FIGS. 15A and 15B, like the first embodiment, the isolation region 12 that partitions element regions is formed on the semiconductor substrate 10, and thereafter, recesses for burying components such as the first conductive layer 14 later are formed. The active silicon regions 10b and the end silicon region 10a are demarcated by the isolation region 12. Next, the first conductive layer 14 is formed.

Figure 16A:
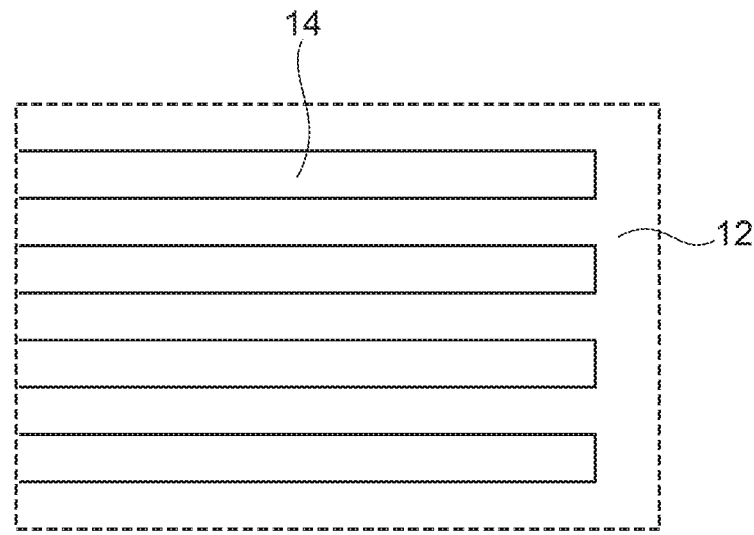
FIGS. 16A and 16B are diagrams illustrating a method of manufacturing the semiconductor memory device according to the third embodiment, and illustrate schematic views in an exemplary process stage following FIGS. 15A and 15B.
Figure 16B:
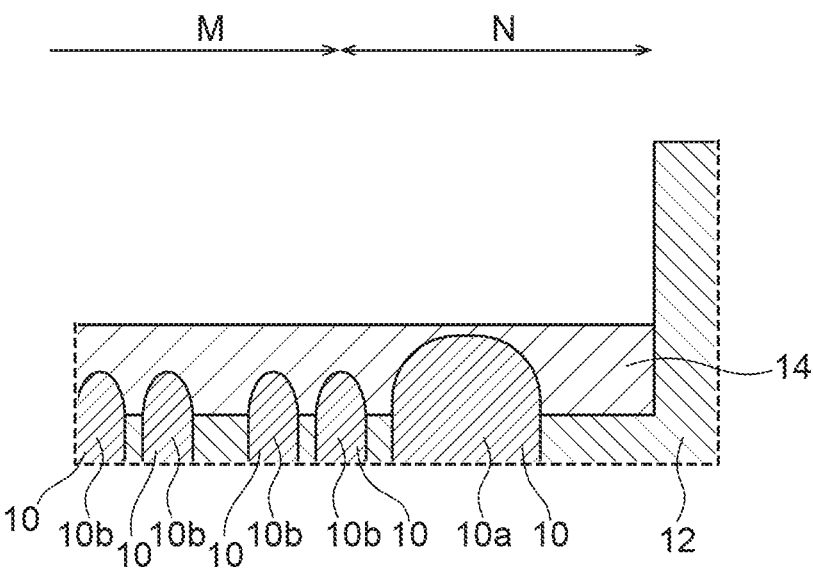

Next, as illustrated in FIG. 16A, anisotropic dry etching is performed to etch back the entire surface, and the thickness of the first conductive layer 14 is decreased. In this case, the first conductive layer 14 may be etched back until the upper surface of the first conductive layer 14 becomes lower than the upper surface position of the end silicon region 10a and the active silicon regions 10b. This is because even if the first conductive layer 14 is divided by the end silicon region 10a and the active silicon regions 10b, electrical continuity is secured by an intermediate conductive layer 22 described later.

Figure 17A:
FIGS. 17A and 17B are diagrams illustrating a method of manufacturing the semiconductor memory device according to the third embodiment, and illustrate schematic views in an exemplary process stage following FIGS. 16A and 16B.
Figure 17B:
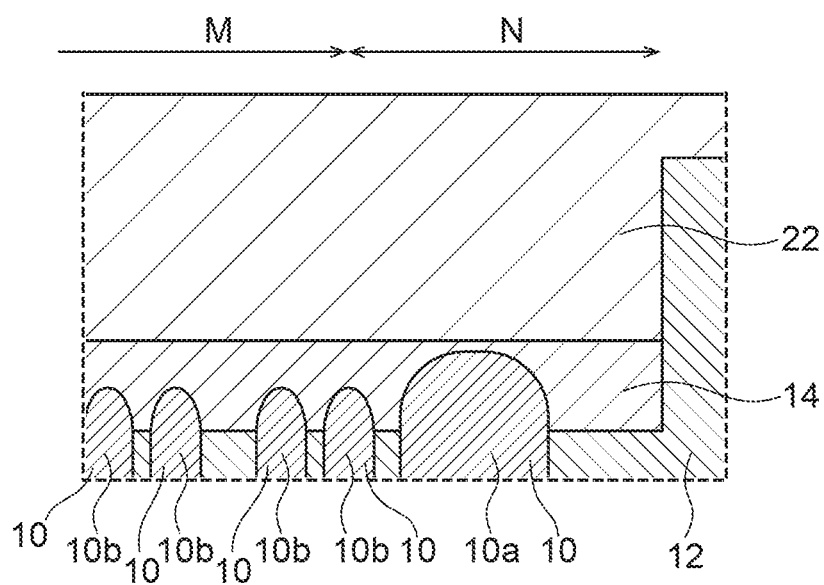

Next, as illustrated in FIG. 17A, the intermediate conductive layer 22 is formed over the entire surface. The intermediate conductive layer 22 includes a material having a lower work function than the first conductive layer 14 and a higher work function than the second conductive layer 20 described later. The intermediate conductive layer 22 can be formed by CVD or sputtering, for example.

Figure 18A:
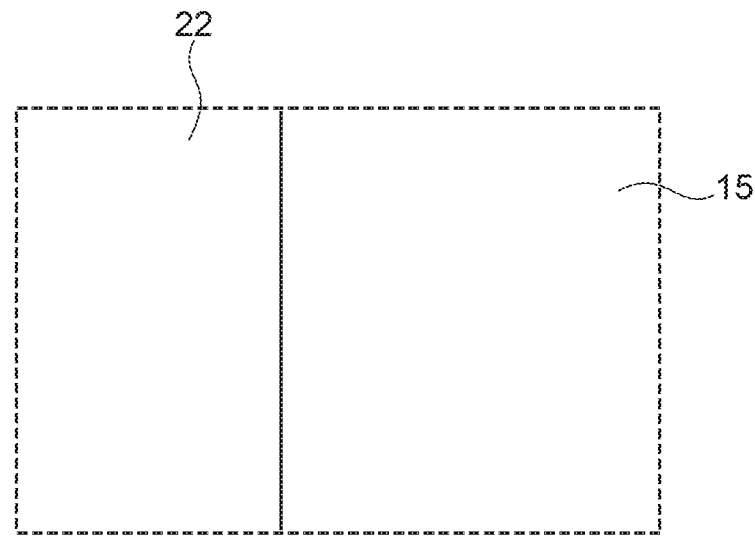
FIGS. 18A and 18B are diagrams illustrating a method of manufacturing the semiconductor memory device according to the third embodiment, and illustrate schematic views in an exemplary process stage following FIGS. 17A and 17B.
Figure 18B:
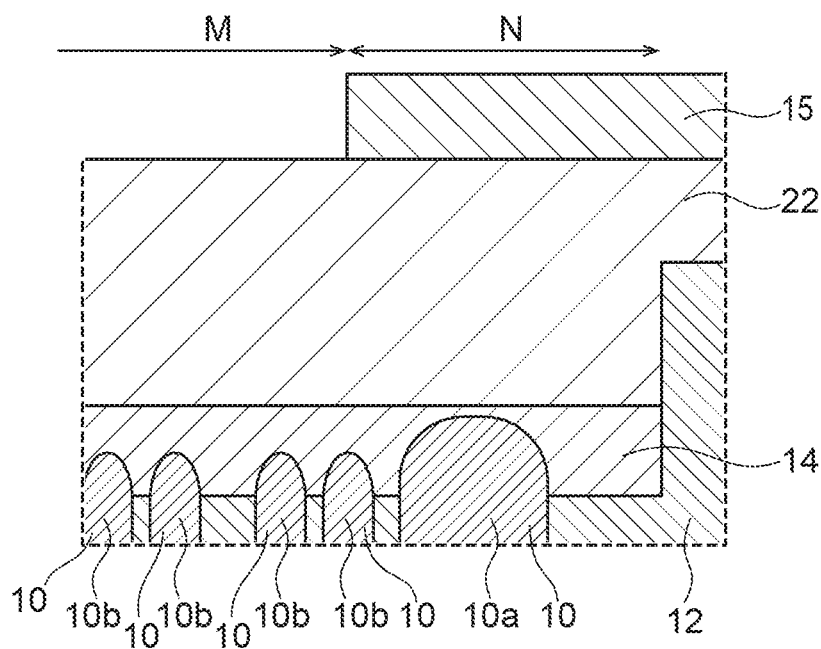

Next, as illustrated in FIGS. 18A and 18B, the photoresist 15 is formed using known lithography technology on the memory mat end region N. The photoresist 15 is not formed in the memory cell region M.

Figure 19A:
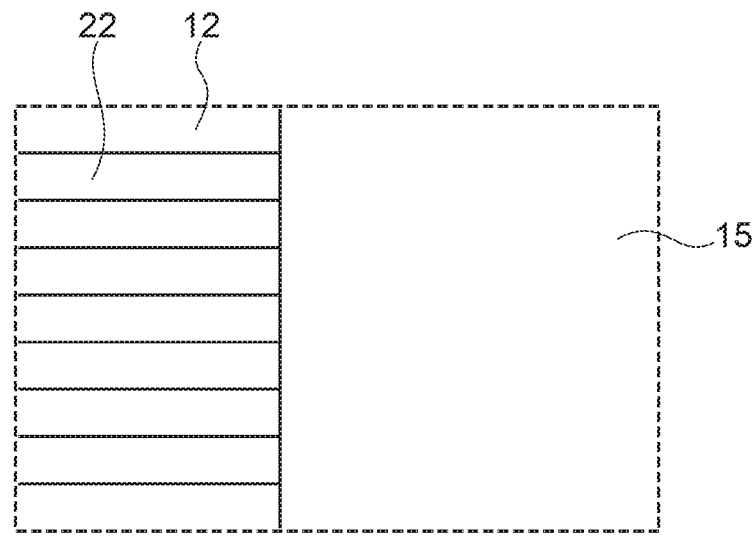
FIGS. 19A and 19B are diagrams illustrating a method of manufacturing the semiconductor memory device according to the third embodiment, and illustrate schematic views in an exemplary process stage following FIGS. 18A and 18B.
Figure 19B:
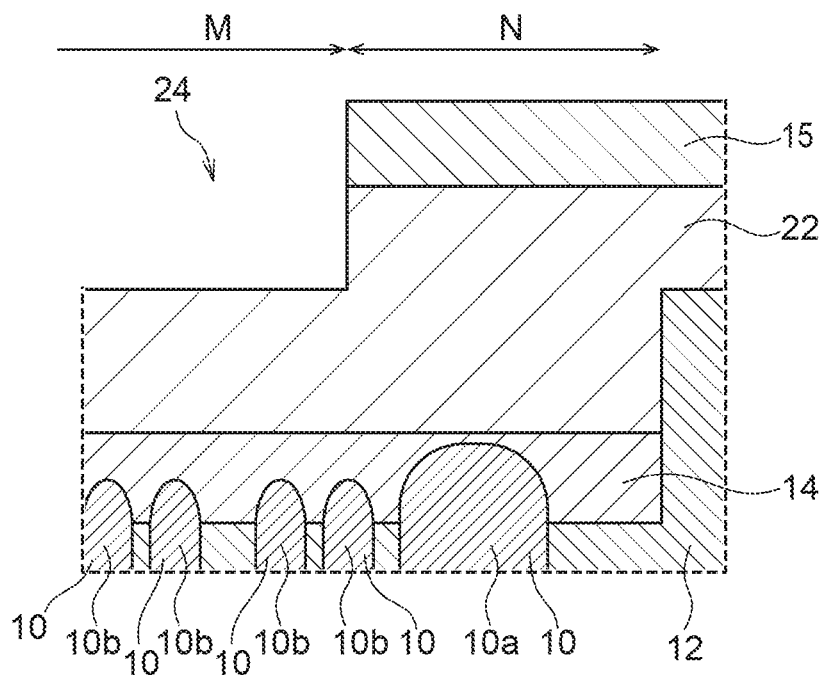

Next, as illustrated in FIGS. 19A and 19B, anisotropic dry etching is performed on the intermediate conductive layer 22 of the memory cell region M using the photoresist 15 as a mask, and the thickness of the intermediate conductive layer 22 is decreased. With this arrangement, as illustrated in FIG. 19B, a depression 24 is formed in the intermediate conductive layer 22 of the memory cell region M. In this way, in the first and second embodiments, the depression 17 is formed in the first conductive layer 14 positioned in the lowermost layer, but in the third embodiment, the depression 24 is formed in the intermediate conductive layer 22 positioned intermediately.

Figure 20A:
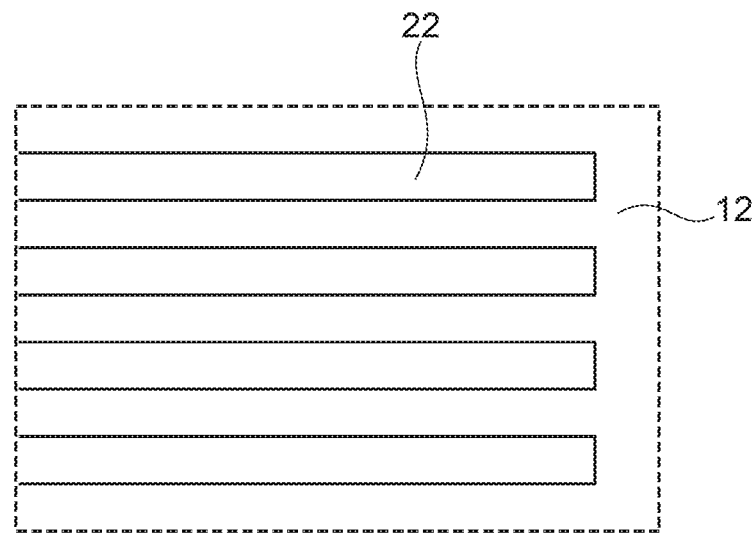
FIGS. 20A and 20B are diagrams illustrating a method of manufacturing the semiconductor memory device according to the third embodiment, and illustrate schematic views in an exemplary process stage following FIGS. 19A and 19B.
Figure 20B:
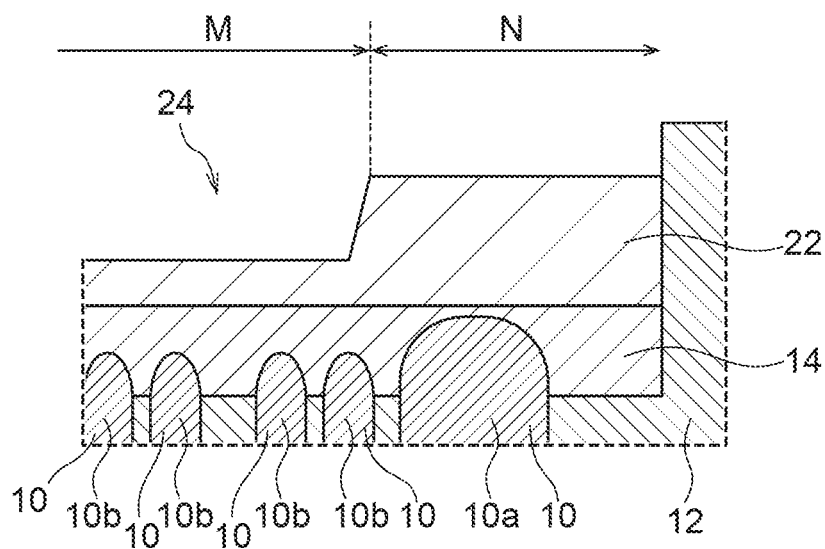

Next, as illustrated in FIGS. 20A and 20B, by removing the photoresist 15 and performing anisotropic dry etching on the intermediate conductive layer 22, the intermediate conductive layer 22 is etched back. With this arrangement, the thickness of the intermediate conductive layer 22 in the memory cell region M and the memory mat end region N is decreased. The amount of etch-back of the intermediate conductive layer 22 is controlled by controlling the duration of the anisotropic dry etching, for example.

Figure 21A:
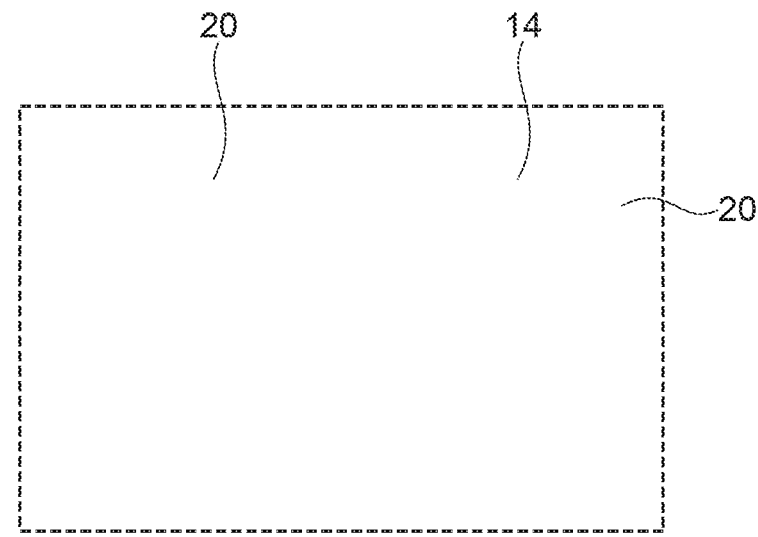
FIGS. 21A and 21B are diagrams illustrating a method of manufacturing the semiconductor memory device according to the third embodiment, and illustrate schematic views in an exemplary process stage following FIGS. 20A and 20B.
Figure 21B:
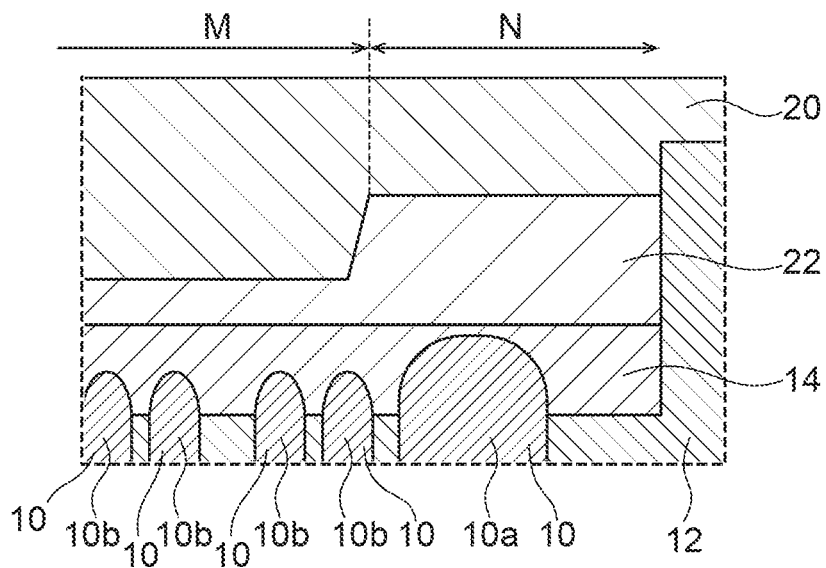

Next, as illustrated in FIGS. 21A and 21B, the second conductive layer 20 is formed on the intermediate conductive layer 22. The second conductive layer 20 includes a material having a lower work function than the intermediate conductive layer 22.

Figure 22A:
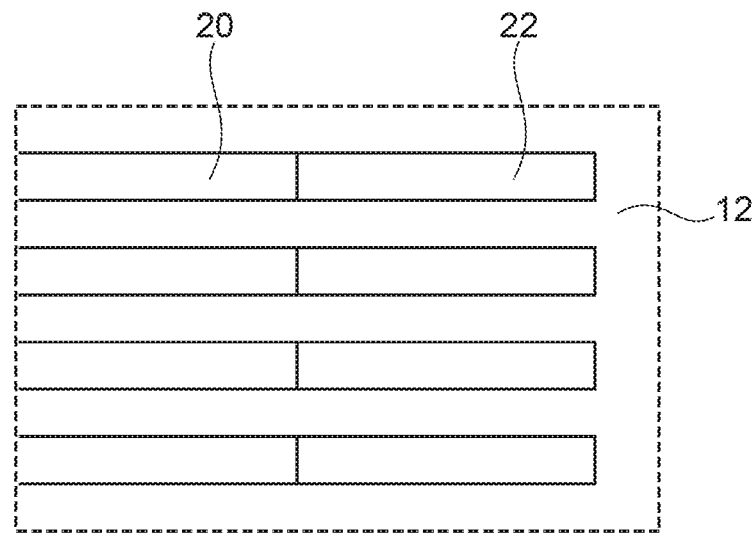
FIGS. 22A and 22B are diagrams illustrating a method of manufacturing the semiconductor memory device according to the third embodiment, and illustrate schematic views in an exemplary process stage following FIGS. 21A and 21B.
Figure 22B:
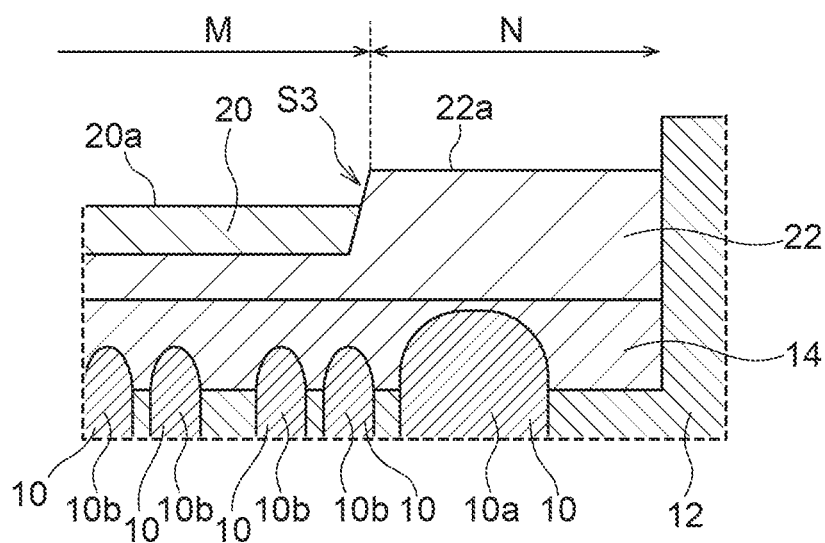

Next, as illustrated in FIGS. 22A and 22B, the second conductive layer 20 is etched back by performing anisotropic dry etching, and the second conductive layer 20 is formed in only the depression 24 formed in FIG. 20B. In this step, the anisotropic dry etching is performed under conditions by which the etch rate of the intermediate conductive layer 22 is lower than the etch rate of the second conductive layer 20. In this step, by controlling the duration of the anisotropic dry etching for example, the second conductive layer 20 in the memory mat end region N is removed, leaving the second conductive layer 20 only in the depression 24 of the memory cell region M.

At this time, an upper surface position 22a of the intermediate conductive layer 22 in the memory mat end region N is higher than the upper position 20a of the second conductive layer 20 in the memory cell region M. Also, a step S3 is formed between the upper surface position 22a and the upper position 20a at the boundary between the memory cell region M and the memory mat end region N. Also, the height difference between the upper surface position 22a and the upper position 20a, or in other words the height of the step S3, is controlled by controlling the duration of the anisotropic dry etching performed on the intermediate conductive layer 22 in the memory cell region M using the photoresist 15 as a mask and the duration of the anisotropic dry etching performed on the second conductive layer 20.

Figure 23A:
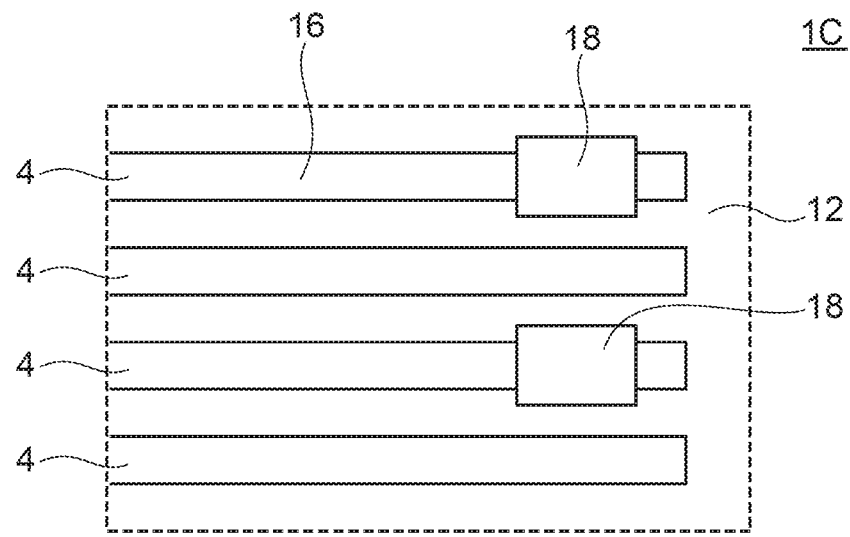
FIGS. 23A and 23B are diagrams illustrating the semiconductor memory device and a method of manufacturing the same according to the third embodiment, and illustrate schematic views in an exemplary process stage following FIGS. 22A and 22B.
Figure 23B:
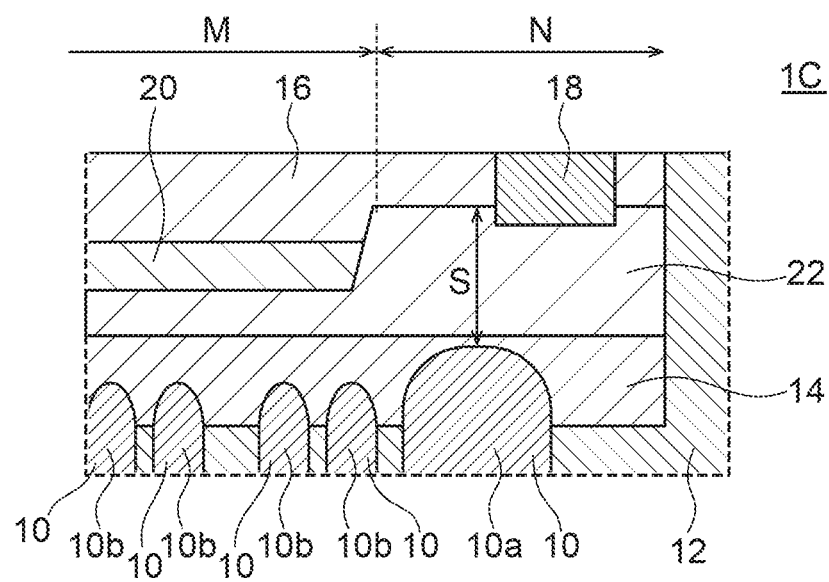

Next, as illustrated in FIGS. 23A and 23B, the cap fill layer 16 is formed, and the contact 18 that penetrates through the cap fill layer 16 and reaches the upper surface of the first conductive layer 14 is formed in the memory mat end region N.

Figure 24A:
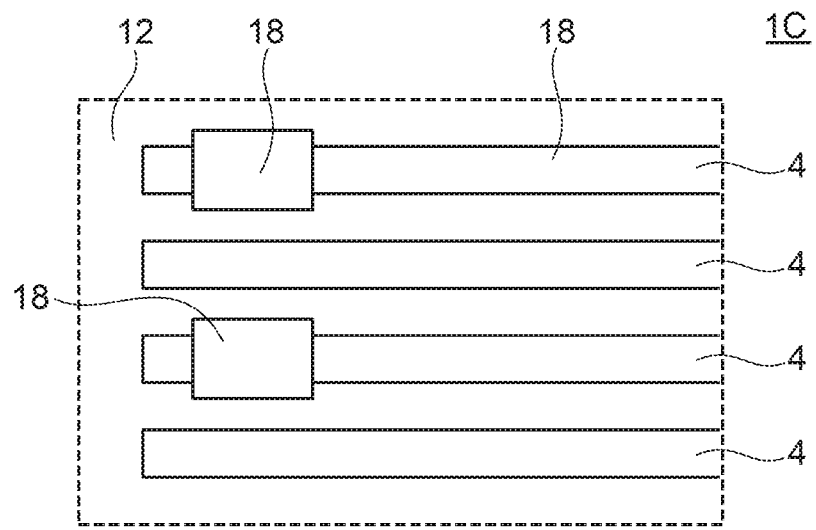
FIGS. 24A and 24B are diagrams illustrating a semiconductor memory device and a method of manufacturing the same according to the third embodiment, and are schematic views in the same process stage as FIGS. 23A and 23B.
Figure 24B:
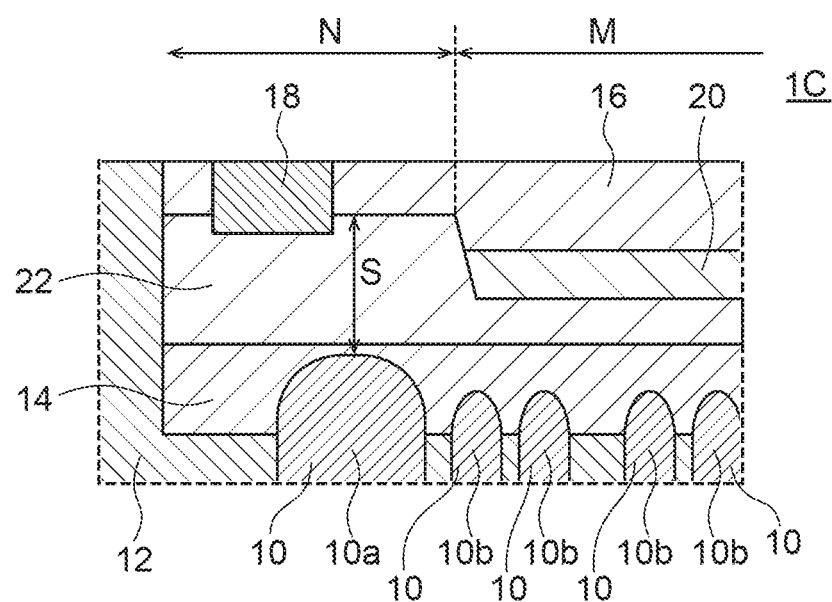

FIGS. 24A and 24B are diagrams illustrating a configuration of the semiconductor memory device 1C in the same step as FIGS. 23A and 23B. FIGS. 24A and 24B are diagrams illustrating a diagrammatic configuration of a memory cell region in the memory mat end region A in FIG. 2 and in a memory mat end region B on the opposite side in the word line direction D. The configuration illustrated in FIGS. 24A and 24B illustrate a configuration that is the mirror reflection of the configuration illustrated in FIGS. 23A and 23B.

In FIGS. 23B and 24B, the total thickness S of the first conductive layer 14 and the intermediate conductive layer 22 on the end silicon region 10a can be formed thicker than the total thickness of the first conductive layer 14, the second conductive layer 20, and the intermediate conductive layer 22 on the active silicon regions 10b. Also, the first conductive layer 14 and the intermediate conductive layer 22 on the end silicon region 10a are provided with a sufficient thickness S as illustrated in FIGS. 23B and 24B.

Through the above steps, the semiconductor memory device 1C according to the third embodiment can be completed.

According to the semiconductor memory device and the method of manufacturing the same according to the third embodiment, effects similar to the first and second embodiments are obtained. Also, according to the semiconductor memory device and the method of manufacturing the same according to the third embodiment, it is possible to form a gate electrode with the first conductive layer 14, the intermediate conductive layer 22, and the second conductive layer 20 having respectively different work functions. More specifically, a configuration in which the first conductive layer 14 having a higher work function than the intermediate conductive layer 22 is disposed lowermost and the second conductive layer 20 having a lower work function than the intermediate conductive layer 22 is disposed between the first conductive layer 14 and the second conductive layer 20 can be achieved. With this arrangement, a configuration provided with a gate electrode configured to lower the work function gradually in the order of the first conductive layer 14, the intermediate conductive layer 22, and the second conductive layer 20 can be achieved. With this arrangement, in the case of using this gate electrode as the gate electrode of a DRAM access transistor, it is possible to relax the electric field near the source-drain of the access transistor.

Consequently, because the data retention characteristics of the DRAM can be improved further, high-performance DRAM can be achieved.

As above, DRAM is described as an example of the semiconductor memory devices 1A, 1B, and 1C according to the various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor memory devices 1A, 1B, and 1C. Furthermore, devices other than memory, including logic ICs such as a microprocessor and an application-specific integrated circuit (ASIC) for example are also applicable as the semiconductor memory devices 1A, 1B, and 1C according to the foregoing embodiments.

Also, in the semiconductor memory devices 1A, 1B, and 1C according to the embodiments, the materials contained in the first conductive layer 14, the second conductive layer 20, and the intermediate conductive layer 22 may be selected from among any of various types of electrical conducting materials having work functions as described, or in other words, having work functions that satisfy the following relationship:

first conductive layer 14>second conductive layer 20>intermediate conductive layer 22.

For the first conductive layer 14, the second conductive layer 20, and the intermediate conductive layer 22, a compound containing any of a semiconductor, a metal, or both can be used. For example, a material selected from among Si, Ti, W, another metal, or a compound containing any of the above, or a material containing a combination of the above can be used. Materials like TiN are one such example of a compound containing any of Si, Ti, N, or another metal.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A semiconductor memory device comprising:
a memory cell region;
a memory mat end region;
a memory mat including the memory cell region and the memory mat region;
a plurality of first silicon regions arranged in the memory cell region;
a second silicon region arranged in the memory mat end region; and
a first conductive layer provided in the memory cell region and the memory mat end region,
wherein an upper surface position of the second silicon region in the memory mat end region is higher than the upper surface position of the first silicon region in the memory cell region, and
wherein the upper surface position of the first conductive layer in the memory mat end region is higher than the upper surface position of the first conductive layer in the memory cell region.

2. The semiconductor memory device of claim 1, wherein an isolation region is provided between the plurality of first silicon regions and between the plurality of first silicon regions and the second silicon region.

3. The semiconductor memory device of claim 1, wherein a cap fill layer is provided on the first conductive layer, and
wherein a plurality of contacts penetrating the cap fill layer and reaching the upper surface of the first conductive layer are provided in the memory mat end region.

4. The semiconductor memory device of claim 1, wherein a second conductive layer is provided on the first conductive layer in the memory cell region.

5. The semiconductor memory device of claim 4, wherein the upper surface position of the first conductive layer in the memory mat end region is higher than the upper surface position of the second conductive layer in the memory cell region.

6. The semiconductor memory device of claim 4, wherein the work function of the second conductive layer is lower than the work function of the first conductive layer.

7. The semiconductor memory device of claim 4, wherein a cap fill layer is provided on the first conductive layer and the second conductive layer, and a plurality of contacts that penetrate the cap fill layer and reach the upper surface of the first conductive layer are provided in the memory mat end region.

8. The semiconductor memory device of claim 1, wherein the first conductive layer comprises a material selected from a semiconductor, a metal, or a compound including a semiconductor or a metal.

9. The semiconductor memory device of claim 4, wherein the second conductive layer comprises a material selected from a semiconductor, a metal, or a compound including a semiconductor or a metal.

10. A semiconductor memory device comprising:
a memory cell region;
a memory mat end region;
a memory mat including the memory cell region and the memory mat end region;
a plurality of first silicon regions arranged in the memory cell region;
a second silicon region arranged in the memory mat end region;
a first conductive layer provided in the memory cell region and the memory mat end region;
an intermediate conductive layer provided in the memory cell region and the memory mat end region; and
a second conductive layer provided in the memory cell region,
wherein the upper surface position of the first conductive layer in the memory mat end region is the same height as the upper surface position of the first conductive layer in the memory cell region, and
wherein the upper surface position of the intermediate conductive layer in the memory mat end region is higher than the upper surface position of the second conductive layer in the memory cell region.

11. The semiconductor memory device of claim 10, wherein the upper surface position of the intermediate conductive layer in the memory cell region is lower than the upper surface position of the intermediate conductive layer in the memory mat end region.

12. The semiconductor memory device of claim 10, wherein the work function of the second conductive layer is lower than the work function of the intermediate conductive layer.

13. The semiconductor memory device of claim 10, wherein the work function of the intermediate conductive layer is lower than the work function of the first conductive layer.

14. The semiconductor memory device of claim 10, wherein the work function of the second conductive layer is lower than the work function of the intermediate conductive layer, and the work function of the intermediate conductive layer is lower than the work function of the first conductive layer.

15. The semiconductor memory device of claim 10,
   wherein a cap fill layer is provided on the second conductive layer and the intermediate conductive layer, and
   wherein a plurality of contacts penetrating the cap fill layer and reaching the upper surface of the intermediate conductive layer are provided in the memory mat end region.

16. The semiconductor memory device of claim 10, wherein each of the first conductive layer, the second conductive layer, and the intermediate conductive layer comprises a material selected from a semiconductor, a metal, or a compound including a semiconductor or a metal.

* * * * *